(12) United States Patent
Ishihara

(10) Patent No.: US 7,944,058 B2
(45) Date of Patent: May 17, 2011

(54) SEMICONDUCTOR DEVICE AND PROCESS FOR FABRICATING THE SAME

(75) Inventor: Masamichi Ishihara, Fukuoka (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 10/577,863

(22) PCT Filed: Nov. 21, 2005

(86) PCT No.: PCT/JP2004/011454
§ 371 (c)(1),
(2), (4) Date: Apr. 28, 2006

(87) PCT Pub. No.: WO2005/043622
PCT Pub. Date: May 12, 2005

(65) Prior Publication Data
US 2008/0265430 A1    Oct. 30, 2008

(51) Int. Cl.
*H01L 23/52* (2006.01)
*H01L 21/00* (2006.01)

(52) U.S. Cl. ........ 257/780; 257/777; 257/723; 257/737; 257/738; 257/686; 257/E25.01; 257/E25.013

(58) Field of Classification Search .................. 257/777, 257/686, E25.013, E25.017; 439/658
See application file for complete search history.

(56) References Cited

U.S. PATENT DOCUMENTS

| | | | |
|---|---|---|---|
| 3,746,934 A * | 7/1973 | Stein ............................ | 361/810 |
| 5,382,827 A * | 1/1995 | Wang et al. .................... | 257/528 |
| 5,952,718 A | 9/1999 | Ohtsuka et al. | |
| 6,362,529 B1 * | 3/2002 | Sumikawa et al. ........... | 257/777 |
| 6,492,718 B2 * | 12/2002 | Ohmori ......................... | 257/686 |
| 6,503,778 B1 | 1/2003 | Yamauchi et al. | |
| 6,774,478 B2 * | 8/2004 | Eto et al. ....................... | 257/686 |
| 6,809,421 B1 * | 10/2004 | Hayasaka et al. ............. | 257/777 |
| 6,873,054 B2 * | 3/2005 | Miyazawa et al. ........... | 257/774 |

(Continued)

FOREIGN PATENT DOCUMENTS

DE    10047963    3/2001

(Continued)

OTHER PUBLICATIONS

The Institute of Electrical Engineers of Japan, Research Reports of Materials Research Society, vol. EFM-02-6, No. 1-8, p. 31-35.

(Continued)

*Primary Examiner* — Leonardo Andújar
*Assistant Examiner* — William Harriston
(74) *Attorney, Agent, or Firm* — Volentine & Whitt, P.L.L.C.

(57) ABSTRACT

A thin stacked semiconductor device has a plurality of circuits that are laminated and formed sequentially in a specified pattern to form a multilayer wiring part. At the stage for forming the multilayer wiring part, a filling electrode is formed on the semiconductor substrate such that the surface is covered with an insulating film, a post electrode is formed on specified wiring at the multilayer wiring part, a first insulating layer is formed on one surface of the semiconductor substrate, the surface of the first insulating layer is removed by a specified thickness to expose the post electrode, and the other surface of the semiconductor substrate is ground to expose the filling electrode and to form a through-type electrode, A second insulating layer is formed on one surface of the semiconductor substrate while exposing the forward end of the through-type electrode, and bump electrodes are formed on both electrodes.

27 Claims, 23 Drawing Sheets

U.S. PATENT DOCUMENTS

| | | | |
|---|---|---|---|
| 6,995,455 B2 * | 2/2006 | Nemoto et al. | 257/621 |
| 7,071,719 B2 * | 7/2006 | Sato et al. | 324/750.3 |
| 7,253,527 B2 * | 8/2007 | Tanida et al. | 257/774 |
| 7,259,454 B2 * | 8/2007 | Tanida et al. | 257/698 |
| 7,276,799 B2 * | 10/2007 | Lee et al. | 257/777 |
| 7,365,416 B2 * | 4/2008 | Kawabata et al. | 257/686 |
| 7,372,137 B2 * | 5/2008 | Saeki | 257/684 |
| 7,459,777 B2 * | 12/2008 | Nakamura | 257/686 |
| 7,537,959 B2 * | 5/2009 | Lee et al. | 438/106 |
| 7,598,617 B2 * | 10/2009 | Lee et al. | 257/777 |
| 2002/0009634 A1 * | 1/2002 | Oogaku | 429/180 |
| 2002/0028532 A1 | 3/2002 | Tsunashima | |
| 2002/0030266 A1 * | 3/2002 | Murata | 257/698 |
| 2002/0109236 A1 | 8/2002 | Kim et al. | |
| 2003/0060034 A1 | 3/2003 | Beyne et al. | |
| 2003/0062620 A1 | 4/2003 | Shibata | |
| 2003/0127736 A1 * | 7/2003 | Eto et al. | 257/737 |
| 2003/0183943 A1 | 10/2003 | Swan et al. | |
| 2004/0080013 A1 * | 4/2004 | Kimura et al. | 257/499 |
| 2004/0145044 A1 * | 7/2004 | Sugaya et al. | 257/698 |
| 2005/0046002 A1 * | 3/2005 | Lee et al. | 257/678 |
| 2005/0263869 A1 * | 12/2005 | Tanaka et al. | 257/686 |
| 2006/0038300 A1 * | 2/2006 | Tanida et al. | 257/773 |
| 2006/0073701 A1 * | 4/2006 | Koizumi et al. | 438/666 |
| 2007/0018320 A1 * | 1/2007 | Tanida et al. | 257/737 |
| 2007/0096292 A1 * | 5/2007 | Machida | 257/700 |
| 2007/0126085 A1 * | 6/2007 | Kawano et al. | 257/621 |
| 2007/0187812 A1 * | 8/2007 | Izumi | 257/700 |
| 2007/0262470 A1 * | 11/2007 | Ichiryu et al. | 257/783 |
| 2008/0061402 A1 * | 3/2008 | Ishihara et al. | 257/621 |
| 2008/0224322 A1 * | 9/2008 | Shinogi | 257/777 |

FOREIGN PATENT DOCUMENTS

| | | |
|---|---|---|
| DE | 10049551 | 5/2001 |
| JP | 10-027824 | 1/1998 |
| JP | 10-223833 | 8/1998 |
| JP | 2001-250913 | 9/2001 |
| JP | 2003-046057 | 2/2003 |
| JP | 2003-110084 | 4/2003 |
| JP | 2003-309221 | 10/2003 |

OTHER PUBLICATIONS

Journal of the Surface Finishing Society of Japan, vol. 52, No. 7, 2001, p. 479-483.

* cited by examiner

FIG. 25
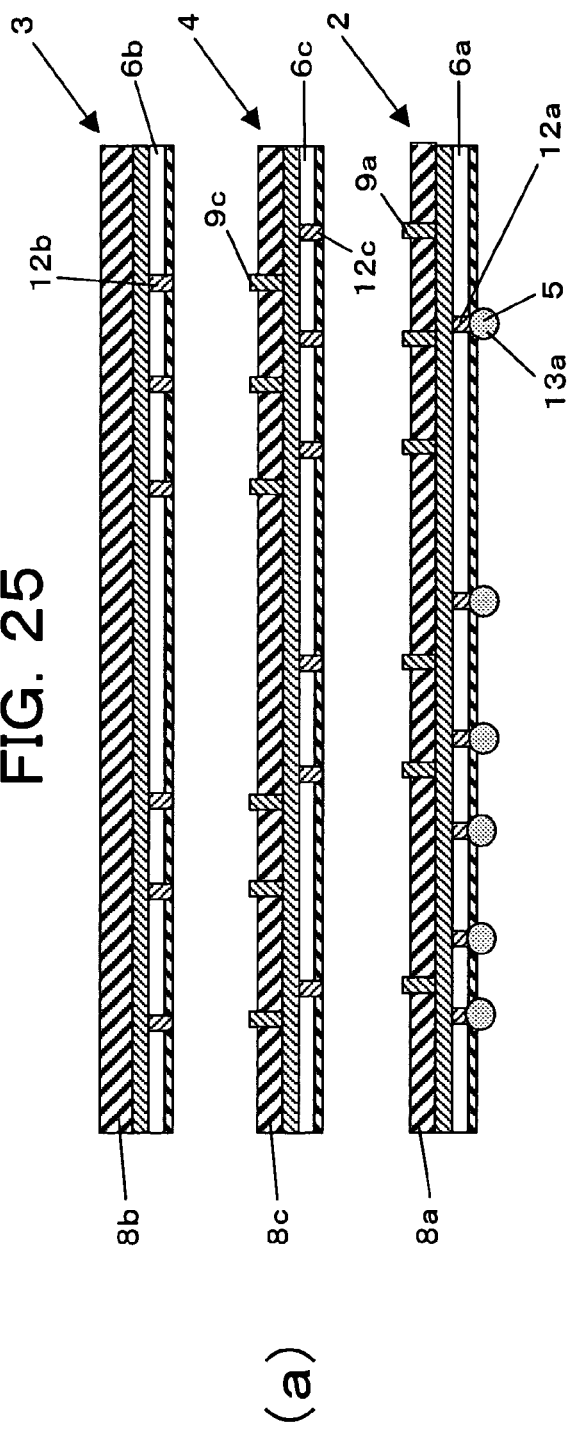
(a)
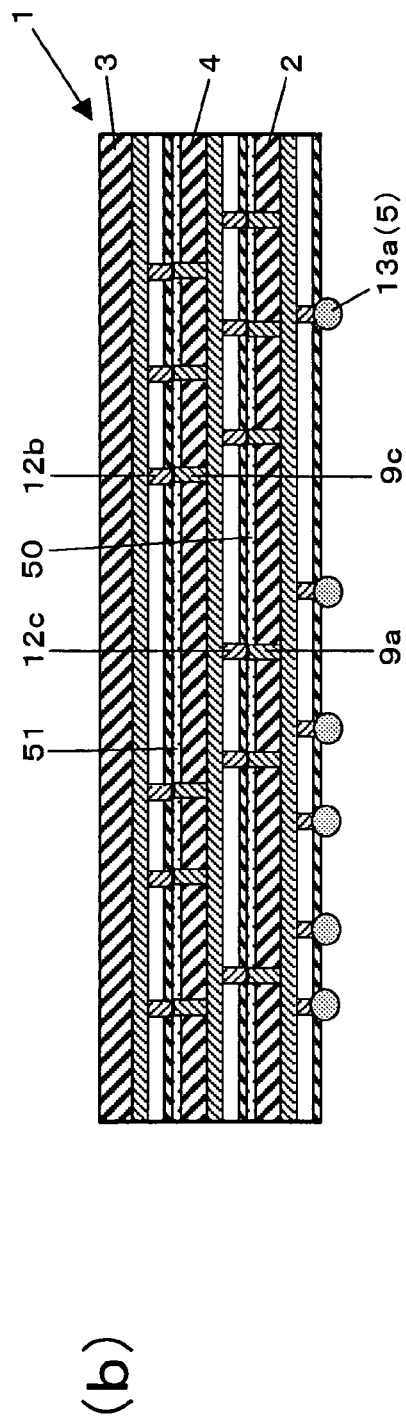
(b)

SEMICONDUCTOR DEVICE AND PROCESS FOR FABRICATING THE SAME

TECHNICAL FIELD

The present invention relates to a semiconductor device for allowing thin forming and high-speed operation and a process for fabricating the same, and in particular to technology effectively applicable to manufacturing technology of laminating a plurality of semiconductor devices sequentially to form a stacked semiconductor device.

BACKGROUND ART

Accompanied by trend toward multifunction and compactness of various electronic apparatuses, semiconductor devices incorporated in an electronic apparatus leads to such a structure with a lot of built-in circuit elements even with compactness. As a method of improving integration density of a semiconductor device (integrated circuit device), three-dimensional stacked semiconductor device is known.

For example, such a structure of planning intensive integration with LSI chips having through-type electrodes over a plurality of stages stacked and secured on an interposer is proposed (for example, Patent Document 1 and Non-Patent Document 1).

A three-dimensional device with first to third semiconductor substrates stacked to form an integrated circuit is known. In this three-dimensional device, an SOI substrate is used in the third semiconductor device (for example, Patent Document 2).

As technology necessary for manufacturing a three-dimensional stacked LSI, there is technology of forming through-type electrodes in a semiconductor substrate. The current process of forming through-type electrodes in a silicon (Si) wafer still requires a lot of steps (for example, Non-Patent Document 2).

[Patent Document 1]: Japanese Patent Laid-Open No. 2003-46057

[Patent Document 2]: Japanese Patent Laid-Open No. 2001-250913

[Non-Patent Document 1]: The Institute of Electrical Engineers of Japan, Research Reports of Materials Research Society, VOL. EFM-02-6, No. 1-8, P. 31-35

[Non-Patent Document 2]: Journal of the Surface Finishing Society of Japan, VOL. 52, No. 7, 2001, P. 479-483

DISCLOSURE OF THE INVENTION

Problems to be Solved by the Invention

Conventional three-dimensional stacked semiconductor devices have problems as described below.

(1) In a multilayer structure of laminating LSI chips (for example, three chips and more), mainly an individual interposer is frequently provided to implement lamination with that interposer. In this case, an individual flip-chip technique is frequently adopted from a point of view of characteristics. Flip-chip mounting will get costly. In addition, since an interposer is interposed individually, the inter-chip connection path is lengthened, characteristics are deteriorated as well.

(2) Connection with bonding wire to replace a flip chip is applicable to around three layers or four layers. However, increase in the number of wires will require addition to the number of steps. Due to wires, the connection path will be lengthened and increase in impedance will lead to deterioration in characteristics (high speed operation). Moreover, due to problems in handling, thin bear chips have a limitation for forming them thinly in its entirety.

(3) In order to increase the yield factor of a finished product, a final test must be carried out with a bear chip prior to mounting (lamination), but the final test with the bear chip and the final test with so-called KGD (Known Good Die) are extremely costly due to difficulty in handling at the moment.

(4) Lamination in a plurality of sites on a chip is limited to two steps at best, and even in this case, the connection path will be lengthened to be apt to influence characteristics.

System in Package (SiP) is overwhelmingly less costly in development and shorter in development period compared with System on Chip (SoC) and is technology to playing a role in sophisticated semiconductors in the future. SiP is used in cellular phones and digital cameras and the like, but further intensive integration is being demanded. Therefore, demand for four-layer or five-layer lamination is expected to arise in the near future, and moreover, combination thereof is assumed to demand flexibility.

An object of the present invention is to provide a stacked semiconductor device capable of allowing short connection path between semiconductor devices and excellent in characteristics.

Another object of the present invention is to provide a thin stacked semiconductor device allowing a various types of semiconductor devices respectively different in configuration to be laminated over a plurality of steps.

An object of the present invention is to provide a process for fabricating a semiconductor device that enables a well productive and highly reliable thin stacked semiconductor device to be fabricated inexpensively.

An object of the present invention is to provide a process of fabricating a stacked semiconductor device in which electronic parts including various types of semiconductor devices different in configuration can be easily laminated over a plurality of steps.

An object of the present invention is to provide a semiconductor device that allows a connection path to its outside to get short and size thereof to get thin and fabrication to get inexpensive.

The above described as well as other objects and novel characteristics of the present invention will become apparent with reference to descriptions as well as attached drawings hereof.

Means for solving the Problems

Summary of representative inventions among those disclosed herein will be briefly described as follows.

(1) A stacked semiconductor device of the present invention has a first semiconductor device having outside electrode terminals on its lower surface, a second semiconductor device electrically connected with the above described first semiconductor device through joints and secured on the above described first semiconductor device and a third semiconductor device sequentially stacked and secured between the above described first semiconductor device and second semiconductor device through joints, wherein the above described first semiconductor device has:

a semiconductor substrate;

a multilayer wiring part including a plurality of circuit elements formed at a first main surface side of the above described semiconductor substrate and wiring connected with the above described circuit elements;

a first insulating layer for covering the above described multilayer wiring part;

a second insulating layer for covering a second main surface to become an opposite face against the first main surface of the above described semiconductor substrate;

a plurality of post electrodes formed on respective specified wiring of the above described multilayer wiring part to be exposed in a surface of the above described first insulating layer; and a plurality of through-type electrodes provided to pierce through the above described semiconductor substrate and the above described second insulating layer from specified depth of the above described multilayer wiring part, brought into contact to the above described semiconductor substrate through insulating film and connected with specified wiring of the above described multilayer wiring part respectively, and the above described second semiconductor device has:

a semiconductor substrate;

a multilayer wiring part including a plurality of circuit elements formed at a first main surface side of the above described semiconductor substrate and wiring connected with the above described circuit elements;

a first insulating layer for covering the above described multilayer wiring part;

a second insulating layer for covering a second main surface to become an opposite face against the first main surface of the above described semiconductor substrate;

at least post electrodes formed on respective specified wiring of the above described multilayer wiring part to be exposed in a surface of the above described first insulating layer or a plurality of through-type electrodes provided to pierce through the above described semiconductor substrate and the above described second insulating layer from specified depth of the above described multilayer wiring part, brought into contact to the above described semiconductor substrate through insulating film and connected with specified wiring of the above described multilayer wiring part respectively, and the above described third semiconductor device has:

a semiconductor substrate;

multilayer wiring part including a plurality of circuit elements formed at a first main surface side of the above described semiconductor substrate and wiring connected with the above described circuit elements;

a first insulating layer for covering the above described multilayer wiring part;

a second insulating layer for covering a second main surface to become an opposite face against the first main surface of the above described semiconductor substrate;

a plurality of post electrodes formed on respective specified wiring of the above described multilayer wiring part to be exposed in a surface of the above described first insulating layer;

a plurality of through-type electrodes provided to pierce through the above described semiconductor substrate and the above described second insulating layer from specified depth of the above described multilayer wiring part, brought into contact to the above described semiconductor substrate through insulating film and connected with specified wiring of the above described multilayer wiring part respectively, and in the above described first semiconductor device, the above described post electrodes or the above described through-type electrodes come in the lower surface and the post electrodes or the through-type electrodes in the lower surface is provided with the above described outside electrode terminals;

the above described through-type electrodes or the above described post electrodes in the lower surface of the above described third semiconductor device are electrically connected with the above described post electrodes or the above described through-type electrodes in the upper surface of the above described first semiconductor device through the above described joints;

the above described post electrodes or the above described through-type electrodes in the lower surface of the above described second semiconductor device are electrically connected onto the above described post electrodes or the above described through-type electrodes in the upper surface of the above described third semiconductor device through the above described through-type electrodes.

Such a stacked semiconductor device has, (a) a step of aligning, disposing and forming product forming part in plurality inclusive of specified circuit elements on a first main surface of a semiconductor substrate;

(b) a step of forming a multilayer wiring part by laminating and forming sequentially in a specified pattern wiring and insulating layers being connected electrically with the above described circuit elements;

(c) a step of forming, at a stage for forming the above described multilayer wiring part, a plurality of holes toward a second main surface to become an opposite face against the above described first main surface of the above described semiconductor substrate from specified depth of the above described multilayer wiring part having insulating film on their surfaces and of forming filling electrodes to fill those holes with conductive substance and be electrically connected with specified wiring of the above described multilayer wiring part;

(d) a step of forming post electrodes on respectively specified wiring of the above described multilayer wiring part;

(e) a step of forming, on the first main surface of the above described semiconductor substrate, a first insulating layer to cover the above described post electrodes;

(f) a step of removing the surface of the above described first insulating layer by specified thickness to expose the above described post electrodes;

(g) a step of removing the second main surface of the above described semiconductor substrate from its surface by specified thickness to expose the above described filling electrodes to form through-type electrodes;

(h) a step of removing by etching the second main surface of the above described semiconductor substrate by specified thickness to cause the above described through-type electrodes to protrude by specified length;

(i) a step of forming the second insulating layer of specified thickness on the second main surface of the above described semiconductor substrate in a state of exposing forward ends of the above described through-type electrodes; and (j) a step of cutting the above described semiconductor substrate inclusive of the above described first and second insulating layers in a lattice pattern to divide the above described product forming part; and has (k) a step of forming protruding electrodes at specified exposed ends among the above described through-type electrodes and the above described post electrodes after the above described step (i) or after the above described step (j), wherein through the above described step (a) to step (k), the above described first semiconductor device and third semiconductor device are formed;

through selection of the above described step (a) to step (k), the second semiconductor device having only the above described through-type electrodes or only the above described post electrodes on the lower surface is formed;

next, disposing the above described first semiconductor device so that the above described through-type electrodes or the above described post electrodes come to the lower surface, the above described electrodes on the lower surface are regarded as the above described outside electrode terminals, and thereafter, the above described through-type electrodes or the above described post electrodes in the lower surface of the above described semiconductor device are overlapped and connected to the above described through-type electrodes or the above described post electrodes in the upper surface of the above described first semiconductor device by causing the above described protruding electrodes to undergo temporal heat processing, and next, the above described through-type electrodes or the above described post electrodes in the lower surface of the above described second semiconductor device are overlapped and connected to the above described through-type electrodes or the above described post electrodes in the upper surface of the above described third semiconductor device by causing the above described protruding electrodes to undergo temporal heat processing to fabricate a stacked semiconductor device.

The above described second semiconductor device having only the above described through-type electrodes is formed through:

a step of aligning, disposing and forming product forming part in plurality inclusive of specified circuit elements on a first main surface of the above described semiconductor substrate;

a step of forming a multilayer wiring part by laminating and forming sequentially in a specified pattern wiring and insulating layers being connected electrically with the above described circuit elements;

a step of forming, at a stage for forming the above described multilayer wiring part, a plurality of holes toward a second main surface to become an opposite face against the above described first main surface of the above described semiconductor substrate from specified depth of the above described multilayer wiring part having insulating film on their surfaces and of forming filling electrodes to fill those holes with conductive substance and be electrically connected with specified wiring of the above described multilayer wiring part;

a step of forming a first insulating layer on the first main surface of the above described semiconductor substrate;

a step of removing the second main surface of the above described semiconductor substrate from its surface by specified thickness to expose the above described filling electrodes to form through-type electrodes;

a step of removing by etching the second main surface of the above described semiconductor substrate by specified thickness to cause the above described through-type electrodes to protrude by specified length;

a step of forming the second insulating layer of specified thickness on the second main surface of the above described semiconductor substrate to expose forward ends of the above described through-type electrodes;

a step of cutting the above described semiconductor substrate inclusive of the above described first and second insulating layers in a lattice pattern to divide the above described product forming part; and a step of forming protruding electrodes at exposed portions of the above described through-type electrodes before or after the above described dividing step.

The above described second semiconductor device having only the above described post electrodes is formed through:

a step of aligning, disposing and forming product forming part in plurality inclusive of specified circuit elements on a first main surface of a semiconductor substrate;

a step of forming a multilayer wiring part by laminating and forming sequentially in a specified pattern wiring and insulating layers being connected electrically with the above described circuit elements;

a step of forming post electrodes on respectively specified wiring of the above described multilayer wiring part;

a step of forming, on the first main surface of the above described semiconductor substrate, a first insulating layer to cover the above described post electrodes;

a step of removing the surface of the above described first insulating layer by specified thickness to expose the above described post electrodes;

a step of removing the second main surface of the above described semiconductor substrate from its surface by specified thickness to make the above described semiconductor substrate thin;

a step of forming the second insulating layer of specified thickness on the second main surface of the above described semiconductor substrate;

a step of cutting the above described semiconductor substrate inclusive of the above described first and second insulating layers in a lattice pattern to divide the above described product forming part; and a step of forming protruding electrodes at exposed portions of the above described post electrodes before or after the above described dividing step.

(2) The above described configuration (1) is characterized in that a plurality of second semiconductor devices smaller than the above described first semiconductor device are disposed and secured in parallel on the above described first semiconductor device.

ADVANTAGES OF THE INVENTION

Effects derived by representative inventions among those disclosed herein will be briefly described as follows.

According to means in the item (1), (a) the first, the third and the second semiconductor devices, in fabrication thereof, the first insulating layers are formed at the first main surface sides of the semiconductor substrates and thereafter the second main surfaces of the semiconductor substrates undergo thickness removal by a specified amount, but since the above described first insulating layers act as strength member, the semiconductor substrates can be made thin to a level of around 5 to 50 µm. In addition, since thickness of the insulating layers can also be made thin to a level of around 20 to 100 µm, in such a state that thickness of the protruding electrodes is not considered, respective semiconductor devices can be made to have thickness of, for example, around 40 to 100 µm so that thinning of the stacked semiconductor device can be attained. If a value of the lower limit is taken for thickness of the semiconductor substrates and insulating layers, further thinning can be planned.

(b) In the first, the third and the second semiconductor devices, in connecting the semiconductor device at the lower stage side with the semiconductor device at the upper stage side, connection is carried out in utilization of post electrodes to become columnar provided by piercing through the first insulating layer and through-type electrodes to become columnar provided by piercing through the semiconductor substrate, and therefore, the current pathway will get short to make reduction in inductance attainable and to make electrical property of the stacked semiconductor device good. The post electrodes and through-type electrodes provided in the first insulating layer and semiconductor substrate are short with length thereof being around 5 to 50 μm, and will become sufficiently short compared with length of not less than several hundred micrometers of a bonding wire by means of wire connection. Thereby, high speed operation of the stacked semiconductor device will become feasible.

(c) There is a constraint that the through-type electrodes provided in the semiconductor substrate is formed in a region apart from the region where circuit elements are formed, and nevertheless the disposing locations for wiring regions and the like can be selected comparatively freely. The disposing location for the post electrodes connected with specified wiring of the multilayer wiring part can be determined comparatively freely by deploying wiring. Therefore, by selecting locations to provide the through-type electrodes and the post electrodes, improvement in integration density in the two-dimensional direction can be planned.

(d) The stacked semiconductor device of the present invention will become capable of electrically connecting the semiconductor device at the lower stage side with the semiconductor device at the upper stage side without using any interposer. Consequently, reduction in the number of assembling parts items can be planned and thinning of the stacked semiconductor device can be planned. Use of interposer will lengthen connecting path (current pathway) between semiconductor chips or between semiconductor devices, but no use of interposer will enable the current pathway to get short so that improvement in electrical property can be planned.

(e) In fabricating the stacked semiconductor device of the present invention, the first, the third and the second semiconductor devices are fabricated in use of the semiconductor wafers in fabrication thereof, which together with insulating layers are cut at the final stage to fabricate the first, the third and the second semiconductor devices. Accordingly, since required processing other than stacking and securing the first, the third and the second semiconductor devices is carried out on a wafer level, handling performance is good throughout the steps and wasteful work will get less. Consequently, reduction in production costs can be planned.

(2) According to the above described structure (1), a plurality of second semiconductor devices smaller than the above described first semiconductor device are disposed and secured in parallel on the above described first semiconductor device, and therefore further improvement in integration can be planned.

BRIEF DESCRIPTION OF THE DRAWINGS

FIG. 7 is an enlarged schematic sectional view of a part of the above described filling electrode, multilayer wiring part and the like;

FIG. 25 shows sectional views of respective steps showing a part of a process for fabricating a stacked semiconductor device being Embodiment 5 of the present invention;

DESCRIPTION OF SYMBOLS

Figure 1:
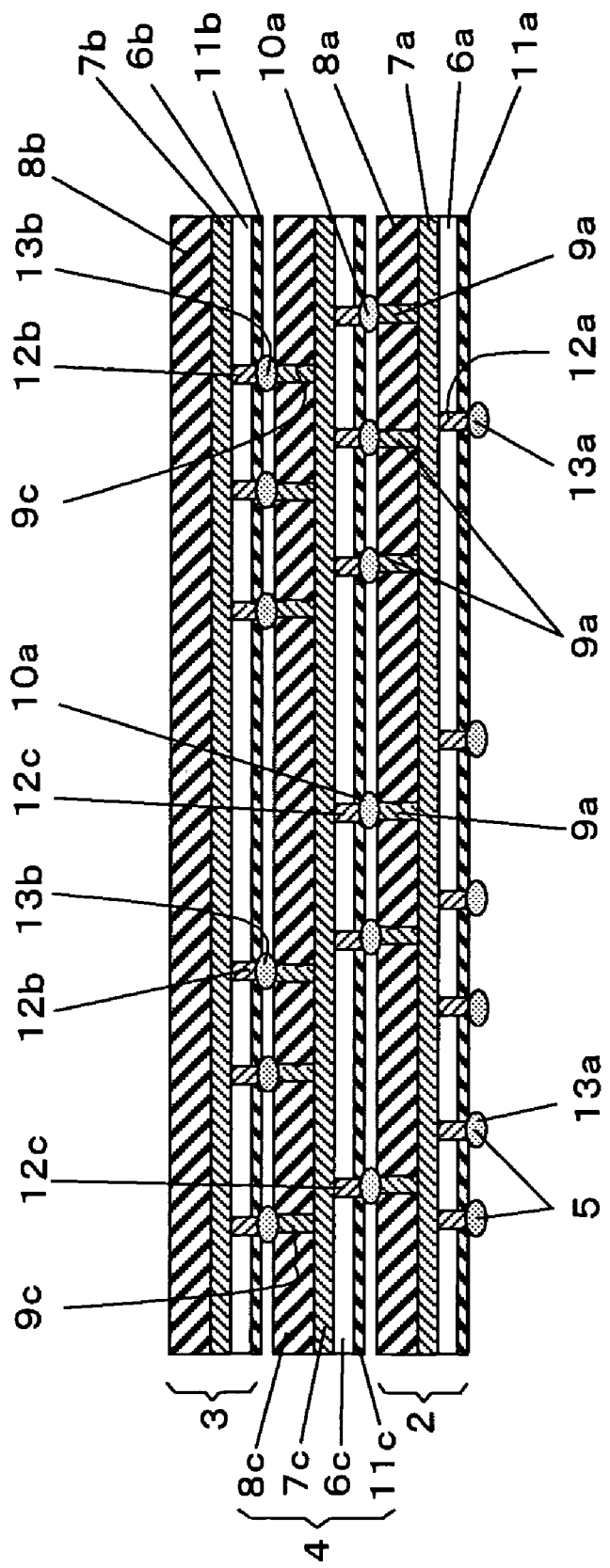
FIG. 1 is a schematic sectional view of a stacked semiconductor device being Embodiment 1 of the present invention.

1 . . . stacked semiconductor device, 2 . . . first semiconductor device, 3 . . . second semiconductor device, 4 . . . third semiconductor device, 5 . . . outside electrode terminal, 6a, 6b, 6c . . . semiconductor substrate, 7a, 7b, 7c . . . multilayer wiring part, 8a, 8b, 8c . . . first insulating layer, 9a, 9b, 9c . . . post electrode, 10a, 10b, 10c . . . protruding electrode, 11a, 11b, 11c . . . second insulating layer, 12 . . . filling electrode, 12a, 12b, 12c . . . through-type electrode, 13a, 13b, 13c . . . protruding electrode, 21 . . . first well, 22 . . . second well, 23 . . . source region, 24 . . . drain region, 25 . . . insulating gate film, 26 . . . gate electrode, 27, 28 . . . electrode, 29 . . . thick oxide film, 30 . . . insulating layer, 31 . . . wiring layer (wiring), 32 . . . electrode pad, 33 . . . hole, 34 . . . insulating film, 40 . . . tray, 41 . . . housing depression, 45 . . . daughter board, 46 . . . bump electrode, 50, 51, 80, 81 . . . underfill layer, 60, 70 . . . metal plate, 61, 71 . . . insulating hole.

BEST MODE FOR CARRYING OUT THE INVENTION

Embodiments of the present invention will be described in detail below with reference to drawings. The like reference characters and numerals designate the parts having the same functions throughout the figures for describing embodiments of the present invention and repeated descriptions thereof will be omitted.

Embodiment 1

Figure 2:
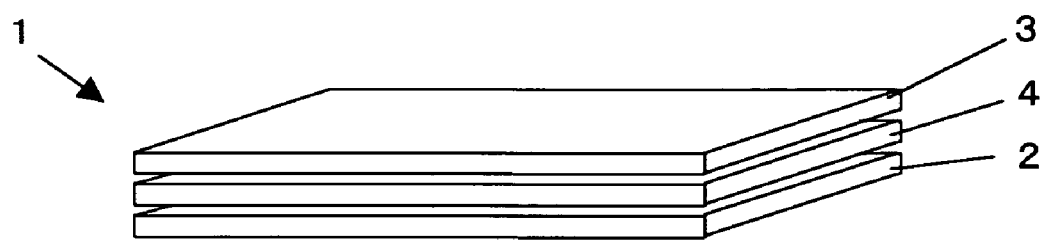
FIG. 2 is a schematic perspective view showing an appearance of the above described stacked semiconductor device.
Figure 3:
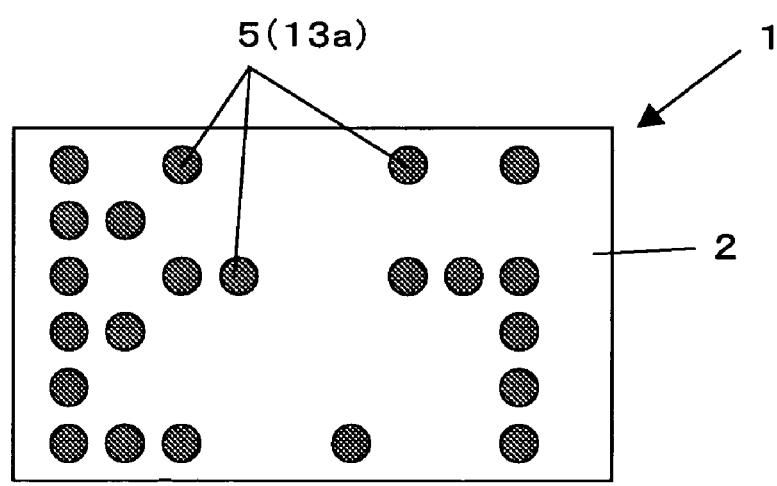
FIG. 3 is a schematic bottom view of the above described stacked semiconductor device.

FIG. 1 to FIG. 20 relate to a stacked semiconductor device being Embodiment 1 of the present invention. FIG. 1 to FIG. 3 relate to structures of the stacked semiconductor device, FIG. 4 to FIG. 19 relate to fabrication of the stacked semiconductor device and FIG. 20 is a drawing showing a state of mounting the stacked semiconductor device.

A stacked semiconductor device 1 fabricated subject to a process of fabricating the present invention consists of, as shown in FIG. 2, a rectangular first semiconductor device 2 to become a lower stage, a middle stage third semiconductor device 4 stacked and secured on the upper surface of this first semiconductor device 2 and an upper stage second semiconductor device 3 stacked and secured on the upper surface of this third semiconductor device 4. In the stacked semiconductor device 1 of Embodiment 1, the first, the second and the third semiconductor devices 2, 3 and 4 have the same planar sizes and are stacked in a corresponding fashion. FIG. 3 is a drawing showing a bottom view of the stacked semiconductor device 1 which has external electrode terminals 5 formed with protruding electrodes provided on the lower surface of the first semiconductor device.

In the first, the second and the third semiconductor devices 2, 3 and 4, respective semiconductor devices are different in presence or absence of through-type electrodes and post electrodes at the stacked and secured surface side and in presence or absence of joints for bringing the through-type electrodes and the post electrodes into connection, and therefore names of respective parts are the corresponding names while symbols for the first semiconductor device 2 are provided with "a" at the end of numerals, symbols for the second semiconductor device 3 are provided with "b" at the end of numerals and symbols for the third semiconductor device 4 are provided with "c" at the end of numerals for description. The protruding electrodes (bump electrodes) provided at exposed ends of the through-type electrode and the post electrode undergo temporal heating processing to form the above described joints.

The first semiconductor device 2 has a rectangular semiconductor substrate 6a. The semiconductor substrate 6a is, for example, made of silicon (Si) and a multilayer wiring part 7a is formed on a first main surface (a surface where circuits such as IC and the like are formed, or the upper surface in FIG. 1) side thereof and the multilayer wiring part 7a is provided with a first insulating layer 8a made of insulating resin thereon. The insulating layer is generally formed of resin, for example, insulating resin such as polyimide resin, epoxy resin and the like, to be used for fabricating a semiconductor device. The semiconductor substrate 6a has thickness of, for example, around 20 µm. The semiconductor substrate 6a may have thickness of around 6 to 50 µm. The insulating layer will become strength member when to fabricate a semiconductor device and is comparatively thick to have, for example, thickness of around 50 µm. The insulating layer may have thickness of around 20 to 100 µm.

There provided are post electrodes 9a made of columnar copper (Cu) piercing through the first insulating layer 8a to be electrically connected to specified wiring of the multilayer wiring part 7a. The post electrodes 9a are exposed on the surface of the first insulating layer 8a. The exposed portions of the post electrodes 9a are provided with protruding electrodes 10a. The protruding electrodes 10a are bump electrodes made of, for example, solder balls, gold balls, copper balls subject to plating with gold on their surfaces and the like.

On the first main surface of the semiconductor substrate 6a active elements such as transistors, diodes and the like in various types of structures and passive elements such as resistance elements, capacitor elements, inductor elements and the like are formed in accordance with necessity. The post electrodes 9a have diameter of around 10 µm and thickness of 50 µm. The post electrodes 9a may have diameter of around 10 to 50 µm and thickness of around 20 to 100 µm. The protruding electrodes 10a are formed of balls having diameter of, for example, around 60 µm in size prior to connection and have thickness of around 40 µm. Balls having diameter of around 40 to 80 µm may be used to form the protruding electrodes 10a.

The second main surface (the bottom surface in FIG. 1) to become the rear side of the above described first main surface of the semiconductor substrate 6a is provided with a second insulating layer 11a made of insulating resin. The second insulating layer 11a is formed of, for example, polyimide resin. The second insulating layer 11a has thickness of, for example, around several micrometers to 10 μm that will at least secure electrical insulation. The embodiment hereof has thickness of around 5 μm.

Through-type electrodes 12a are provided to pierce through the semiconductor substrate 6a as well as the second insulating layer 11a from specified depth of the multilayer wiring part 7a. Those through-type electrodes 12a are electrically connected to specified wiring of the multilayer wiring part 7a. The through-type electrodes 12a are formed of columnar copper plating. The through-type electrodes 12a have diameter of, for example, around 10 μm. The through-type electrodes 12a may have diameter of around several micrometers to 30 μm. The through-type electrodes 12a, as to be described below, contacts the semiconductor substrate 6a through insulating film that comes between the semiconductor substrate 6a and the circumference surface of the through-type electrodes 12a so that they are electrically independent from the semiconductor substrate 6a.

The through-type electrodes 12a are exposed on the surface of the second insulating layer 11a. The exposed portions of those through-type electrodes 12a are provided with protruding electrodes 13a. The protruding electrodes 13a are ball bump electrodes made of, for example, gold balls, copper balls subject to plating with gold on their surfaces, solder balls and the like. The protruding electrodes 13a are also balls in size similar to protruding electrodes 10a. The protruding electrodes may be formed by plating or printing (screen printing). In that case, the protruding electrodes may have thickness of around 10 μm.

The stacked semiconductor device 1 of Embodiment 1 is structured so that, in any of the first, second and third semiconductor devices 2, 3, 4, the first insulating layers 8a, 8b, 8c come to the top and semiconductor substrates 6a, 6b, 6c come to the bottom.

The middle stage third semiconductor device 4 is different from the first semiconductor device 2 in the pattern of the post electrodes 9c and through-type electrodes 12c, but is structured substantially the same as the first semiconductor device 2 in the other portions. The third semiconductor device 4 is not provided with any protruding electrode. The reason thereof is to use, for connection, protruding electrodes of semiconductor device of the counter party to be stacked when to be stacked and secured. However, such a process may be adopted that protruding electrodes are provided in the post electrodes 9c and the through-type electrodes 12c so that the protruding electrodes are connected each other for carrying out stacking and securing.

The third semiconductor device 4 in the middle stage is provided with a multilayer wiring part 7c and a first insulating layer 8c on the first main surface (upper surface) of a semiconductor substrate 6c and the second main surface is provided with an insulating layer 11c. The first insulating layer 8c is provided with a plurality of post electrodes 9c to be electrically connected to specified wiring of the multilayer wiring part 7c. And there are a plurality of through-type electrodes 12c piercing through the second insulating layer 11c from the semiconductor substrate 6c to be electrically connected to specified wiring of the multilayer wiring part 7c. Those through-type electrodes 12c have insulating surface on their circumference and are insulated and separated from the semiconductor substrate 6c.

The through-type electrodes 12c on the lower surface side of the third semiconductor device 4 in the middle stage and the post electrodes 9a on the upper surface side of the first semiconductor device 2 in the lower stage are respectively facing each other and are electrically connected through the protruding electrodes 10a. The protruding electrodes 10a will undergo temporal heat processing to become joints so as to connect the connecting portions. That connection will cause the third semiconductor device 4 to be stacked and secured on the first semiconductor device 2.

The second semiconductor device 3 in the upper stage is structured like the first semiconductor device 2 except that the upper surface is not provided with any post electrode. That is, the second semiconductor device 3 is structured to have a multilayer wiring part 7b as well as a first insulating layer 8b on a first main surface (upper surface) of a semiconductor substrate 6b and a second insulating layer 11b on a second main surface. Through-type electrodes 12b are provided to pierce through the semiconductor substrate 6b and the second insulating layer 11b. The through-type electrodes 12b are electrically connected to specified wiring of the multilayer wiring part 7b. The exposed portions of those through-type electrodes 12b on the surface of the second insulating layer 11b are provided with protruding electrodes 13b.

The through-type electrodes 12b on the bottom surface side of the third semiconductor device 3 in the upper stage and the post electrodes 9c on the upper surface side of the third semiconductor device 4 in the middle stage are respectively facing each other and are electrically connected through the protruding electrodes 13b. That connection will cause the second semiconductor device 3 to be stacked and secured on the third semiconductor device 4.

The protruding electrodes 10a bringing the first semiconductor device 2 and the third semiconductor device 4 into connection will become joints and the protruding electrodes 13b bringing the third semiconductor device 4 and the second semiconductor device 3 into connection will become joints. When the protruding electrodes are formed of balls in diameter of around 60 μm, the protruding electrodes having thickness of around 40 μm can be formed. When the above described joints are formed of protruding electrodes, the joints will have thickness of around 20 μm. In the case where protruding electrodes are formed in post electrodes and through-type electrodes, it is advisable that desired plating film is formed in advance onto a surface where through-type electrodes and protruding electrodes are exposed when it is difficult to form the protruding electrode directly.

Respective semiconductor devices can be caused to have thicknesses of around 40 to 100 μm by respectively selecting specified sizes from the size range shown in the embodiment, and therefore, the stacked semiconductor device 1 stacked and secured in three stages will have thickness of around 200 to 380 μm in case of ball bump electrodes and, in case of protruding electrodes by means of printing, of around 150 to 330 μm that is extremely thin. Height of that stacked semiconductor device 1 will vary in accordance with size (thickness) of the ball bump electrodes and the protruding electrodes by means of printing.

In the stacked semiconductor device 1 fabricated by stacking and securing, the protruding electrodes 13a provided at the bottom surface of the semiconductor substrate 6a will become outside electrode terminals 5. In case of using the first semiconductor device 2 to dispose the first insulating layer 8a at the bottom surface, the protruding electrodes 10a will become the outside electrode terminals 5.

Figure 4:
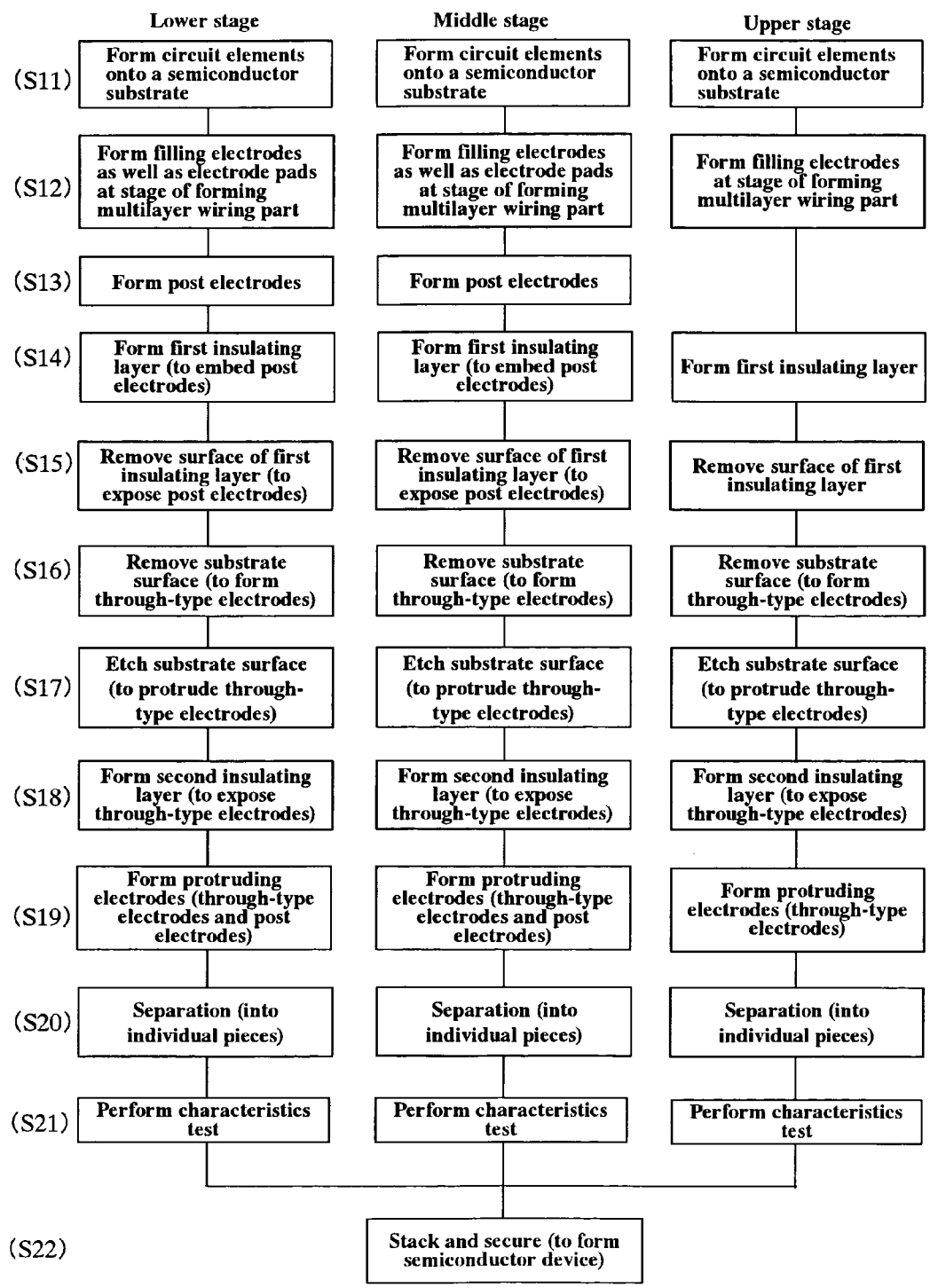
FIG. 4 is a flow chart showing a process for fabricating a stacked semiconductor device of Embodiment 1.

Next, a process for fabricating the stacked semiconductor device 1 of Embodiment 1 hereof will be described. FIG. 4 is a flow chart showing a process for fabricating the stacked semiconductor device 1. That flow chart constitutes respective flowcharts respectively consisting of stages from a step 11 (S11) to a step 21 (S21) to fabricate a first semiconductor device 2 in the bottom stage, a third semiconductor device 4 in the middle stage and a second semiconductor device 3 in the upper stage and a stage of a step S22 to stack and secure the semiconductor devices in the bottom stage, the middle stage and the upper stage.

The first semiconductor device 2 in the lower stage is formed through respective steps of forming circuit elements onto a semiconductor substrate (Step S11), forming filling electrodes as well as electrode pads at a stage of forming multilayer wiring part (Step S12), forming post electrodes (Step S13), forming a first insulating layer (to embed post electrodes: Step S14), removing surface of the first insulating layer (to expose post electrodes: Step S15), removing the substrate surface (to form through-type electrodes: Step S16), etching the substrate surface (to protrude through-type electrodes: Step S17), forming a second insulating layer (to expose the through-type electrode: Step S18), forming protruding electrodes (through-type electrodes and post electrodes: Step S19), separation (into individual pieces: Step S20) and performing a characteristics test (Step S21).

The third semiconductor device 4 in the middle stage is fabricated through the same stages as in the stages for fabricating the above described first semiconductor device 2 in the lower stage, and however the through-type electrodes 12c provided to the lower side are formed in a pattern to face the post electrodes 9a on the upper surface of the first semiconductor device 2 in the lower stage.

Since no post electrode is formed in the second semiconductor device 3 in the upper stage, the stage of Step S13 will become unnecessary. Since no post electrode is provided, a first insulating layer is formed in Step S14 while the surface of the first insulating layer is removed in Step S15 and consideration on post electrodes will be no longer required.

The first, third and second semiconductors 2, 4 and 3 formed in the stage of Step S21 are sequentially stacked in the stacking and securing stage (Step S22) and are stacked and secured through, for example, a reflow oven to fabricate the stacked semiconductor device 1 shown in FIG. 1 to FIG. 3.

Any semiconductor device of the stacked semiconductor device 1 in Embodiment 1 is a semiconductor device in use of a silicon substrate. However, semiconductor devices in use of compound semiconductor such as GaAs, InP or the like and semiconductor devices in use of silicon substrates may be brought into combination. In such a case, circuit elements suitable for material are formed in the semiconductor portions.

Figure 5:
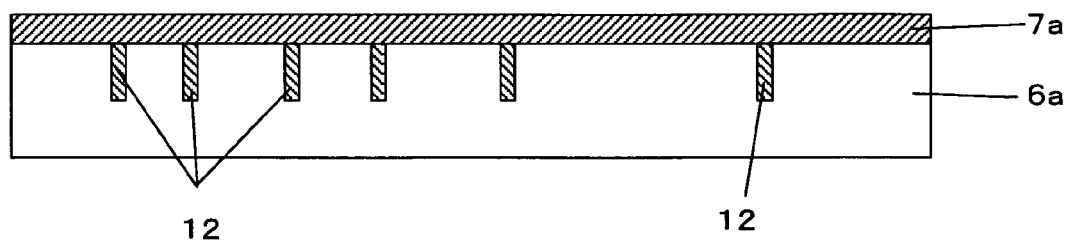
FIG. 5 is a schematic sectional view showing filling electrodes having been formed in a semiconductor substrate with ICs and the like having been formed in the fabricating process.

Next, fabrication of the first semiconductor device 2 in the lower stage will be described. FIG. 5 is a schematic sectional view showing filling electrodes having been formed in a semiconductor substrate (silicon substrate) with ICs and the like having been already formed in fabricating the stacked semiconductor device 1.

In fabricating a semiconductor device, a wide area semiconductor wafer is prepared and thereafter unit circuits inclusive of specified circuit elements are formed on the first main surface of that wafer. Those unit circuits are formed on the first main surface of that wafer while being aligned and disposed in a lattice. Thereafter, subject to respective processes, lastly cut and separated in a checked fashion, a great number of semiconductor elements (semiconductor chips) are formed. That rectangular shape region (portion) to form that unit circuit will be referred to as product forming part herein. Between a product forming part and a product forming part, there positioned is a scribe line to undergo dividing or a dicing region to undergo cutting. Lastly, cutting takes place in that dicing region. In FIG. 5 and forward, only a single product forming part will be shown. Accordingly, as far as there is no problem, a major part of names will be taken from names used in a state of a finished product for descriptions.

As shown in FIG. 5, after a semiconductor substrate 6a having thickness of several hundreds micrometers is prepared, circuits (circuit elements) are formed on a first main surface of that semiconductor substrate 6a (Step S11). A multilayer wiring part 7a is formed on the first main surface of the semiconductor substrate 6a. At the stage for forming that multilayer wiring part 7a, holes are formed on the first main surface of the semiconductor substrate 6a. Thereafter, the surface of the hole undergo oxidization and subsequently a plating film is filled and formed inside the hole. By filling with that plating film, filling electrodes 12 are formed. The holes have, for example, diameter of around several micrometers to 30 µm and depths of around 5 to 50 µm. In the embodiments, they have, for example, diameter of around 10 µm and a depth of 30 µm. In this embodiment, at the point of time when a semiconductor device is formed, the semiconductor substrate 6a is made thin to make the first semiconductor device 2 thin. Therefore, in case of enhancing the thin structure further, the above described holes may be made further shallower so as to make processing the holes easier. The plating film is formed of, for example, copper. The process for forming the filling electrodes 12 may be the other process. For example, such a process may be employed for forming the filling electrodes 12 that subjects to filling the interior of the holes with electrically conductive particles sprayed in an ink jet system and thereafter undergoing hardening by means of heat processing. For example, tungsten, titanium, nickel, aluminum or alloy thereof may be used for filling with CVD (chemical vapor depositing).

Figure 6:
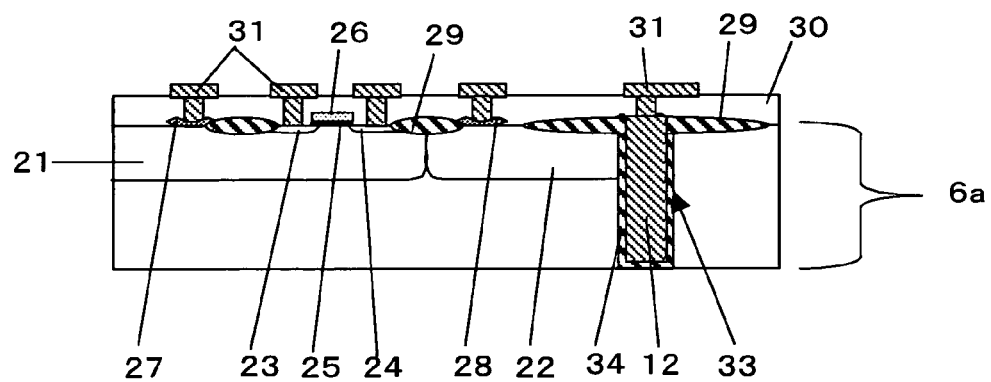
FIG. 6 is an enlarged schematic sectional view of a part of a semiconductor substrate showing the lower portion of the above described filling electrode and multilayer wiring part.

FIG. 6 is an enlarged schematic sectional view of a part of a semiconductor substrate showing the lower layer portion of the above described filling electrode and multilayer wiring part. A semiconductor 6a is a substrate of a first electrically conductive type, and a first well 21 of a second electrically conductive type and a second well 22 of the first electrically conductive type are formed in a surface layer portion on the first main surface side. In the first well 21, a source region 23, a drain region 24 and an insulating gate film 25 are formed and a gate electrode 26 is formed on the insulating gate film 25 to form a field effective transistor (FET). Electrodes 27 and 28 are formed on the surfaces of the first and the second wells 22 respectively. A thick oxide film 29 is selectively provided on the first main surface of the semiconductor substrate 6a.

Figure 7:
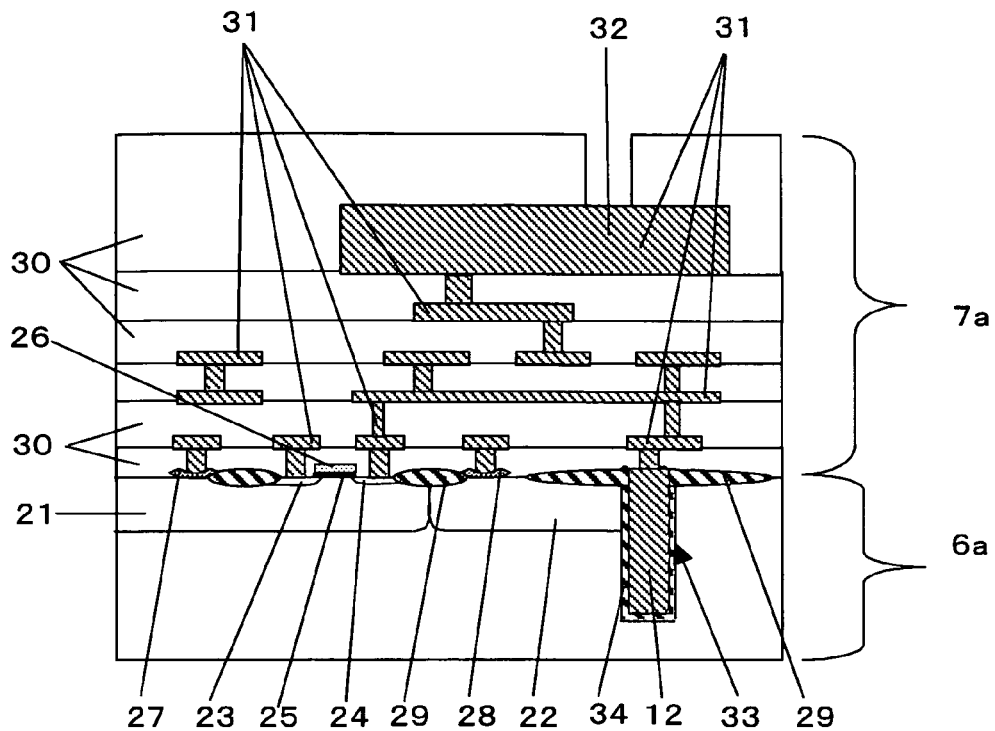

FIG. 7 is an enlarged schematic sectional view of a part of the above described filling electrode, multilayer wiring part and the like. As shown in FIG. 7, on the first main surface of the semiconductor substrate 6a, the insulating layers 30 and the wiring layers (wiring) 31 are alternately laminated and formed in a specified pattern to form a multilayer wiring part 7a. The wiring layer in the uppermost layer forms an electrode pad 32. A part of that electrode pad 32 is exposed. Post electrodes 9a will be formed in the exposed portions. Therefore, the exposed portions become holes having diameter of around 10 µm. FIG. 6 shows the insulating layer 30 and wiring layers (wiring) 31 in the lowest layer of the multilayer wiring part 7a.

At the stage for forming the multilayer wiring part 7a, the above described filling electrode 12 is formed in the semiconductor substrate 6a. In the embodiment, at the stage for having formed the circuit elements and formed the thick oxide film 29, the above described hole 33 is formed on the first main surface side of the semiconductor substrate 6a with photolithography technology and photo etching for normal use. Thereafter, oxidation processing is carried out to form an insulating film 34 on the surface of the hole 33. Moreover, copper plating is carried out to fill the hole 33 with a copper plating film to form the filling electrode 12. For example, the filling electrode 12 will have diameter of around 10 µm and a depth of around 30 µm. Thereby, the filling electrode and the electrode pad are formed (Step S12). The filling electrode 12 will be electrically insulated due to contact with the semiconductor substrate 6a through the insulating film 34.

The above described filling electrode 12 may be formed by spraying electrically conductive liquid in an inkjet system to embed the hole 33. In that case, after spaying, the filled electrically conductive liquid undergoes hardening processing (baking). The other metal, for example, tungsten, titanium, nickel, aluminum or alloy thereof may be used for filling with CVD (chemical vapor depositing) so as to form a CVD film.

As described above, since the insulating film 34 is interposed between the filling electrode 12 and the semiconductor substrate 6a, the filling electrode 12 will be electrically separated (independent) from the semiconductor substrate 6a.

At the time when the insulating layers 30 and the wiring layers (wiring) 31 are alternately laminated and formed sequentially in a specified pattern to form a multilayer wiring part 7a on the first main surface of the semiconductor substrate 6a, the filling electrode 12 is electrically connected with specified wiring of the multilayer wiring part 7a.

Figure 8:
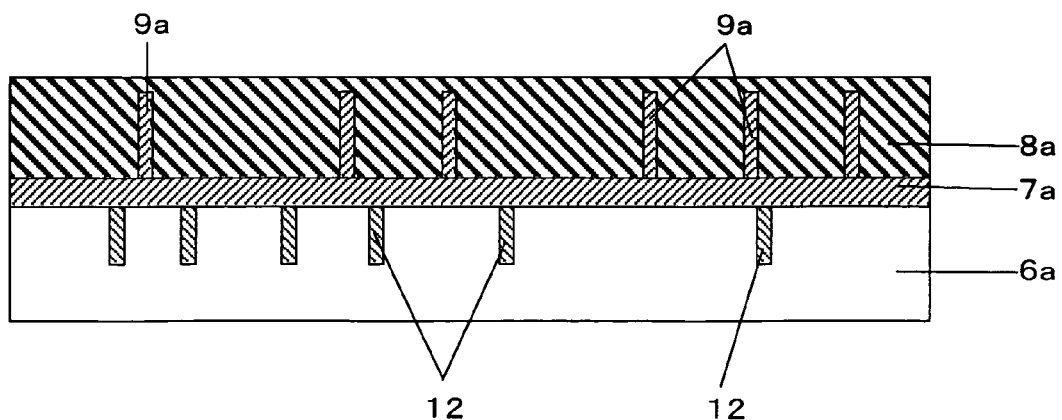
FIG. 8 is a schematic sectional view of the above described semiconductor substrate showing a state with a post electrodes and a first insulating layer having been formed on a first major surface.

Next, as shown in FIG. 8, specified positions on the first main surface of the semiconductor substrate 6a undergo plating to form a plurality of columnar post electrodes 9a (Step S13). As for those post electrodes 9a, likewise the above described filling electrodes 12, copper, tungsten, titanium, nickel, aluminum or alloy thereof may be used to form a CVD film.

Next, a first insulating layer 8a is formed on the first main surface of the semiconductor substrate 6a (Step S14). The post electrodes 9a are covered with the first insulating layer 8a. Insulating organic resin such as epoxy resin, polyimide resin and the like is used for the first insulating layer 8a. The first insulating layer 8a is formed with, for example, transfer molding or squeegee printing.

Figure 9:
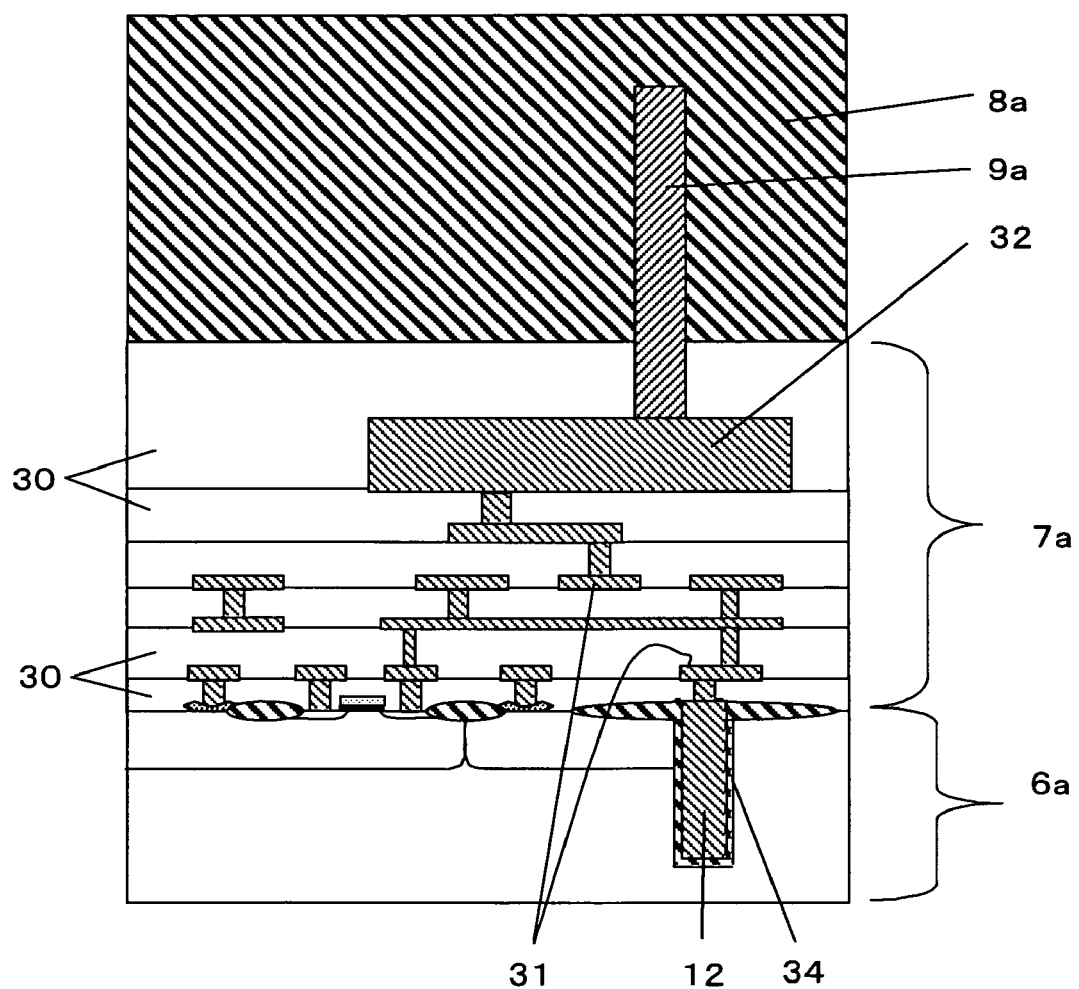
FIG. 9 is an enlarged schematic sectional view of a part of a semiconductor substrate with the above described post electrode and first insulating layer having been formed.

FIG. 9 is an exemplary enlarged schematic sectional view of a part of a semiconductor substrate with the above described post electrode and first insulating layer having been formed thereon. A post electrode 9a is formed on the upper surface of the electrode pad 32 and the post electrode 9a is covered with the first insulating layer 8a. FIG. 9 depicts the post electrode 9a to be formed thinner than the electrode pad 32 by a large margin. This assumes direct use of a process for fabricating an IC and the like having an electrode pad to be connected with wires. In order to connect an IC and the like with electrically conductive wires, the electrode pad is shaped rectangular with a side having length of around 80 to 100 µm. Therefore, in the embodiment, the post electrode 9a is provided on that electrode pad 32. Use of the electrode pad 32 by means of an established IC process as wiring portion for forming the post electrode 9a is also one technique. But, the present invention will not be limited thereto, but the post electrode 9a may be formed in a wiring portion with small area.

Figure 10:
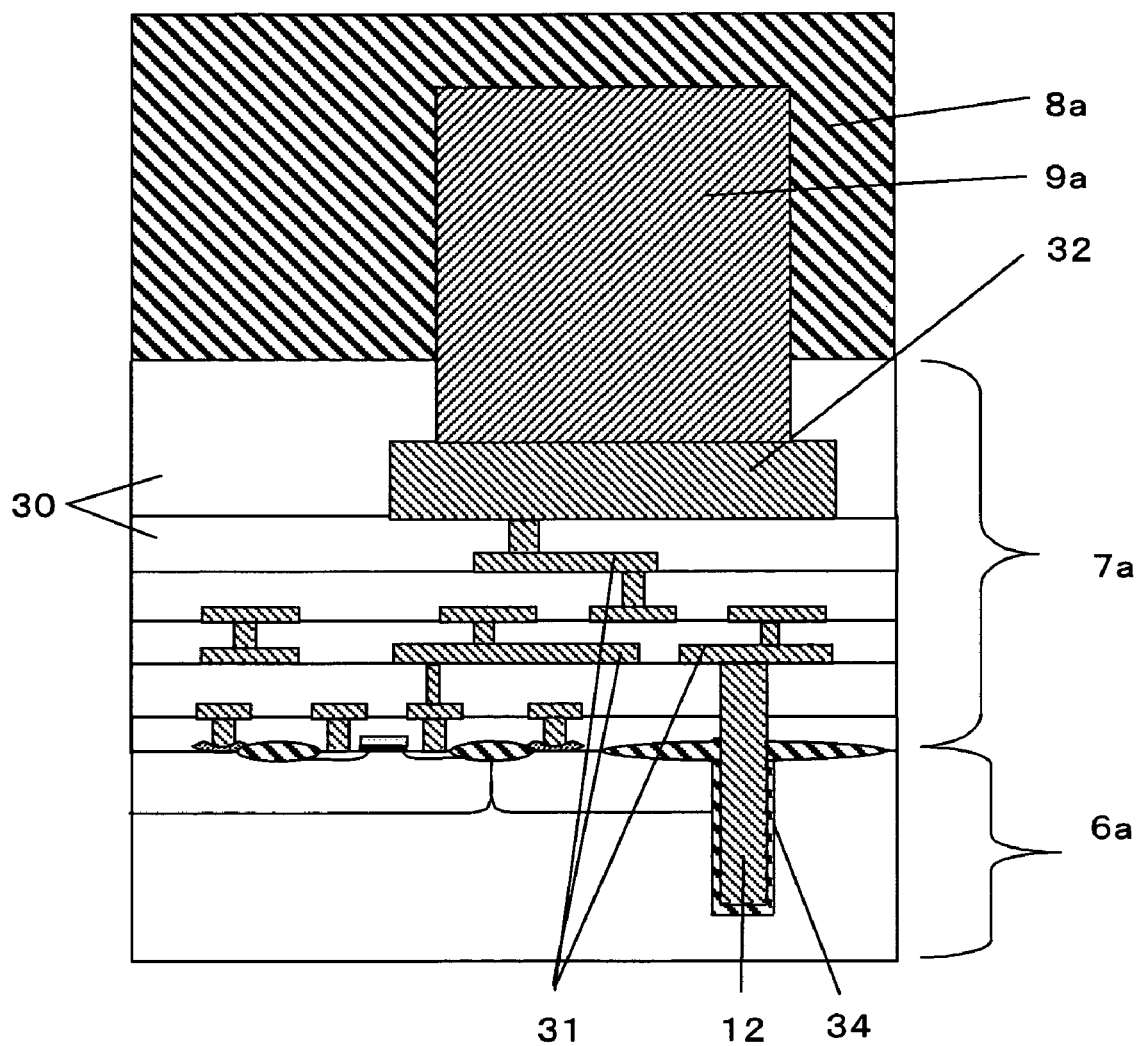
FIG. 10 is an enlarged schematic sectional view showing a part of a filling electrode structure being a variation of Embodiment 1.
Figure 11:
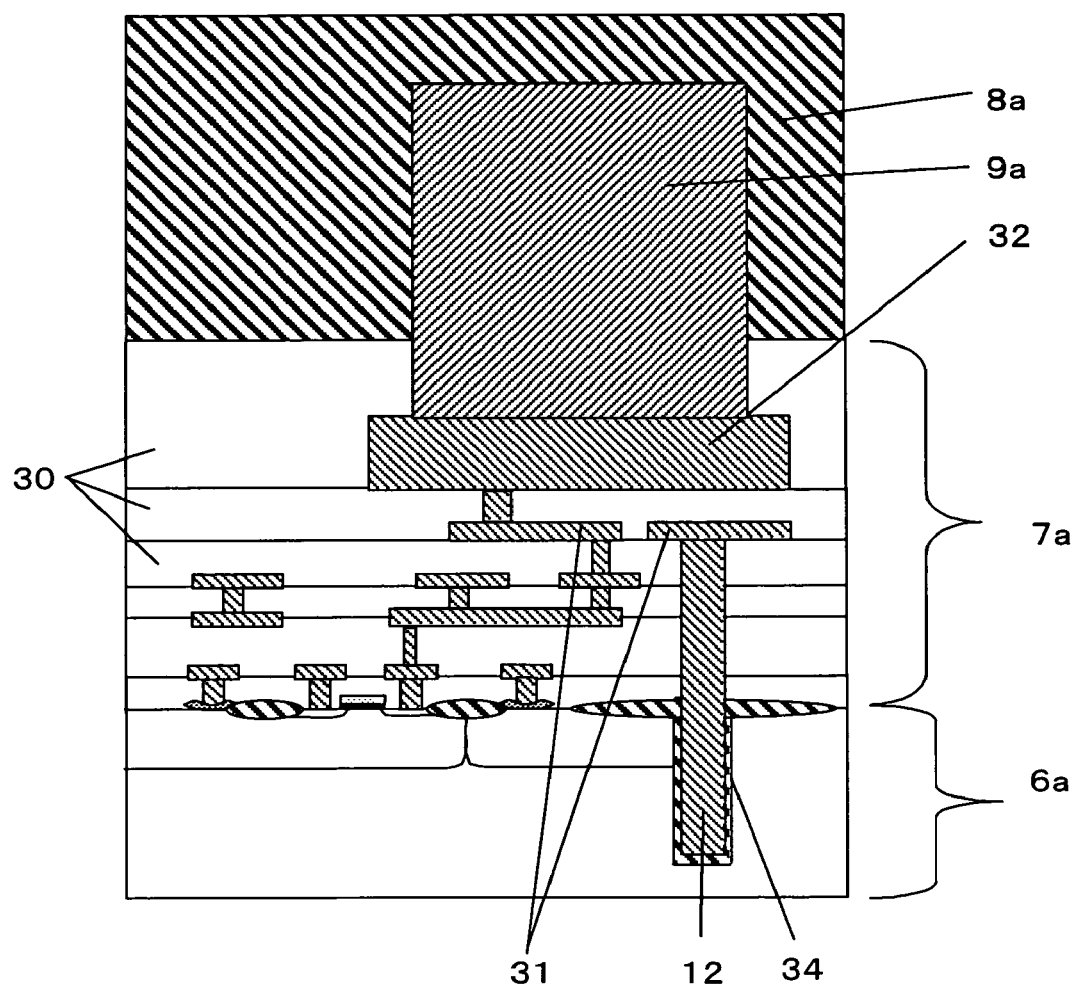
FIG. 11 is an enlarged schematic sectional view showing a part of a filling electrode structure being another variation of Embodiment 1.

FIG. 10 and FIG. 11 are examples (variations) with the post electrode 9a formed on the electrode pad 32 to have nearly the same diameter as the electrode pad 32.

The structure of FIG. 10 is an example where the filling electrode 12 has been formed at a comparatively early stage for forming the multilayer wiring part 7a. After having formed the first layer and the second layer of insulating layers 30 on the first surface side of the semiconductor substrate 6a, the hole 33 is formed in those two layers of the insulating layer 30 and semiconductor substrate 6a and subsequently the hole 33 is filled with a plating film to form the filling electrode 12.

The structure in FIG. 11 is an example of a filling electrode 12 that has been formed at a stage of a comparatively later period for forming the multilayer wiring part 7a. After having formed a first layer to a fourth layer of insulating layers 30 on the first surface side of the semiconductor substrate 6a, a hole 33 is formed in those four layers of the insulating layer 30 and the semiconductor substrate 6a, and subsequently the hole 33 is filled with a plating film to form a filling electrode 12.

As shown in FIG. 7, FIG. 10 and FIG. 11, the hole 33 can be formed in a freely selective fashion at a desired stage for forming the multilayer wiring part 7a so as to enable electrical connection with specified wiring (wiring layer 31) of the multilayer wiring part 7a. Since structures in FIG. 7 and FIG. 9 are already described in detail in FIG. 9 and FIG. 10, a part of symbols will be omitted.

Figure 12:
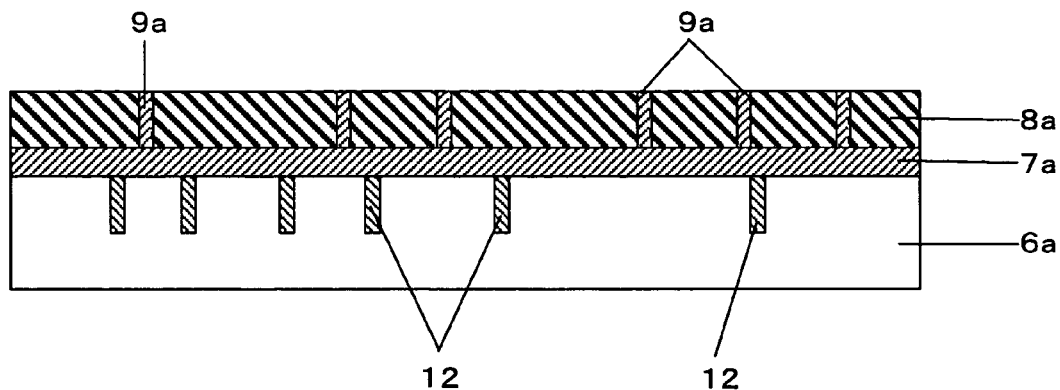
FIG. 12 is a schematic sectional view of a part of a semiconductor substrate showing a state of the surface of the above described first insulating layer being removed by a specified thickness to expose the post electrode.

Next, as shown in FIG. 12, the surface of the first insulating layer 8a is removed by a specified thickness (Step S15). For example, the surface of the first insulating layer 8a is ground so as to expose the forward end of the post electrode 9a. If the quantity of grinding gets larger, the thickness of the post electrode 9a gets shorter and the thickness of the first insulating layer 8a gets thinner as well. In the present embodiment, after making the semiconductor substrate 6a thin to be described later, since the first insulating layer 8a is used as a strength member for supporting the semiconductor substrate 6a, the thickness of the first insulating layer 8a, for example, is set to around 50 µm. In the case where there is no problem in handling the semiconductor substrate 6a in terms of strength, the first insulating layer 8a may be made further thinner. This will lead to thinning of the first semiconductor device 2 and thinning of the stacked semiconductor device 1.

Figure 13:
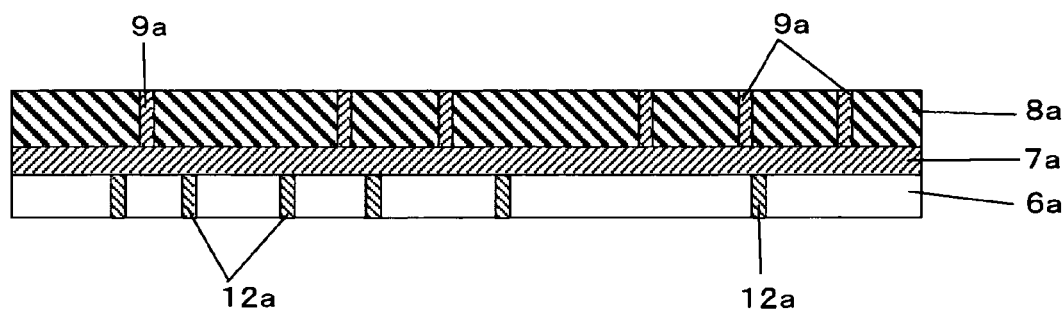
FIG. 13 is a schematic sectional view of the above described semiconductor substrate showing a state of the second main surface being removed by a specified thickness to expose the filling electrode to become a through-type electrode.

Next, as shown in FIG. 13, the second main surface of the semiconductor substrate 6a is ground so as to expose the forward ends of the filling electrodes 12 and to form the through-type electrodes 12 and with the filling electrodes 12 (Step S16). Thereby, the semiconductor substrate 6a will have thickness of around 25 µm. Even if the semiconductor substrate 6a gets thin like this, the first insulating layer 8a is thick and thereby the semiconductor substrate 6a can prevent damages such as cracking at the time of handling or breakage from taking place.

Figure 14:
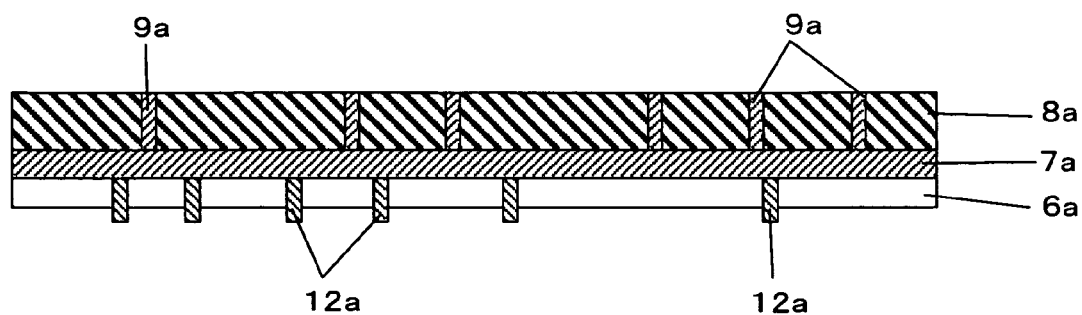
FIG. 14 is a schematic sectional view showing a state of a forward end of the through-type electrode projected by etching the second main surface of the above described semiconductor substrate.

Next, as shown in FIG. 14, the second main surface side of the semiconductor substrate 6a undergoes etching for a specified thickness. Etching is carried out with wet etching with etching solution of a hydrofluoric acid system and the through-type electrodes 12a do not undergo etching. Thereby, the forward ends of the through-type electrodes 12a will be protruded by around 5 µm from the semiconductor substrate 6a having thickness of around 20 µm.

Figure 15:
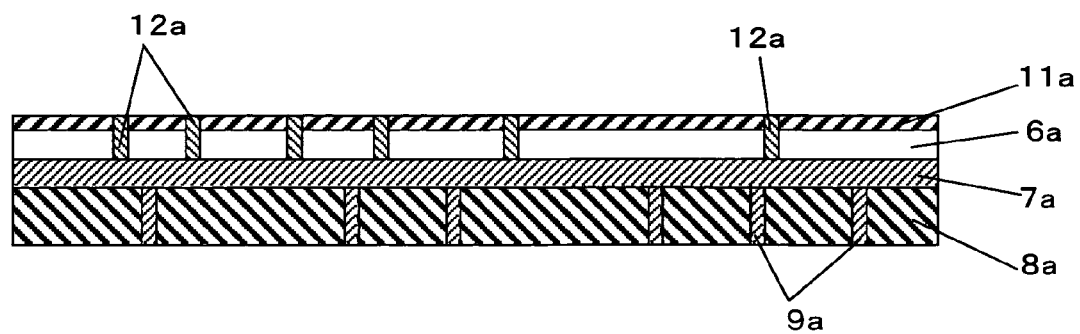
FIG. 15 is a schematic sectional view of the above described semiconductor substrate showing a state of the second insulating layer formed so as to expose the forward tip of the through-type electrode on the second main surface.

Next, as shown in FIG. 15, a second insulating layer 11a is formed on the silicon surface at the second main surface side of the semiconductor substrate 6a. At that time, the second insulating layer 11a is formed so as to expose the forward ends of the through-type electrodes 12a (Step S18). The second insulating layer 11a may be formed with, for example, spinner application, and squeegee printing or film-type substance is pasted by heat processing and pasted with insulating adhesive for forming. Thickness of the second insulating layer 11a is set to thickness that enables electrical insulation to be planned at least. In forming this second insulating layer 11a, it can be formed by applying insulating material that is hydrophobic to through-type electrodes 12a being Cu and is hydrophilic to Si. That is, providing the second insulating layer 11a so as to reach approximate height of protrusion of the through-type electrodes 12a, the forward ends of the through-type electrodes 12a are exposed from the second insulating layer 11a.

Figure 16:
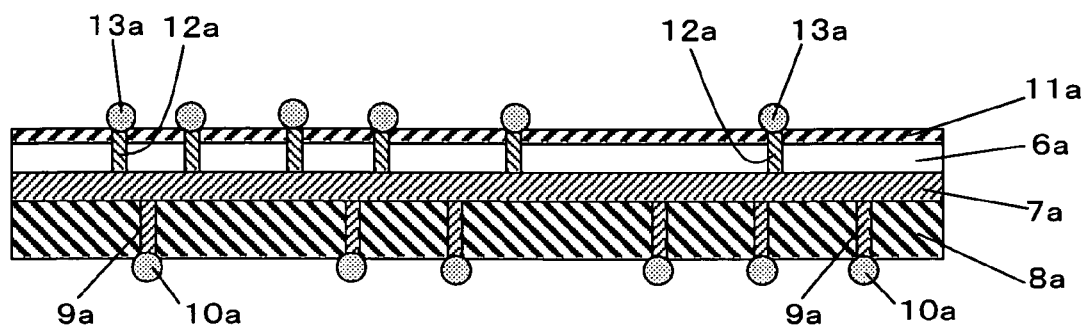
FIG. 16 is a schematic sectional view showing a state with protruding electrodes having been formed on the forward tips of the above described through-type electrodes as well as post electrodes.

Next, as shown in FIG. 16, protruding electrodes 10a and 13a are formed at the forward ends of the post electrodes 9a to be exposed on the front side of the second insulating layer 11a and the forward end of the through-type electrodes 12a to be exposed on the second main surface side of the semiconductor substrate 6a (Step S19). The protruding electrodes 10a and 13a are bump electrodes made of, for example, solder balls, gold balls, copper balls having undergone gold plating on their surfaces and the like or by screen printing and heating. When it is difficult to form protruding electrodes directly to the post electrodes and the through-type electrodes, it is advisable to form a plating film on the exposed surfaces of the post electrodes and the through-type electrodes in advance for making connection well.

Next, the semiconductor wafer is divided in a checked fashion to form individual pieces (Step S20). The drawing has been described not in a state of a semiconductor wafer but in a state of a single product forming part. Therefore, the first semiconductor device 2 that has been divided and formed will have sectional structure shown in FIG. 16 as well. In embodiments, the bump electrodes have been formed and thereafter undergone processing to form individual pieces but the bump electrodes may be formed after processing to form individual pieces.

Figure 17:
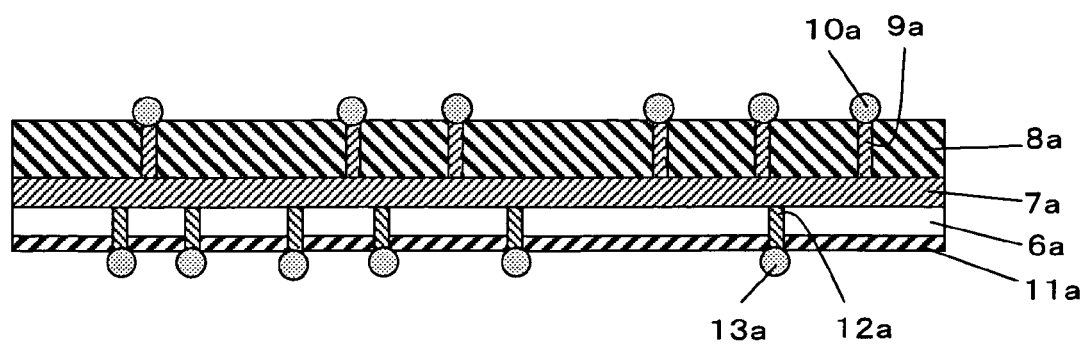
FIG. 17 is a schematic sectional view showing a semiconductor substrate (semiconductor wafer) with the above described semiconductor substrate to come to the lower surface side and the first insulating layer to come to the upper surface side.

In FIG. 16, the semiconductor substrate 6a is disposed to the upper surface side and the first insulating layer 8a is disposed to the lower surface side, and, in FIG. 17, the semiconductor substrate 6a is disposed to the lower surface side and the first insulating layer is disposed to the upper surface side. The first semiconductor device 2 is used as a semiconductor device disposed at the lowest stage at the time of stacking and securing, but in the case where the protruding electrodes 10a are used as shown in FIG. 16 as outside electrode terminals at that time, or as shown in FIG. 17, the protruding electrodes 13a will be used as outside electrode terminals.

Figure 18:
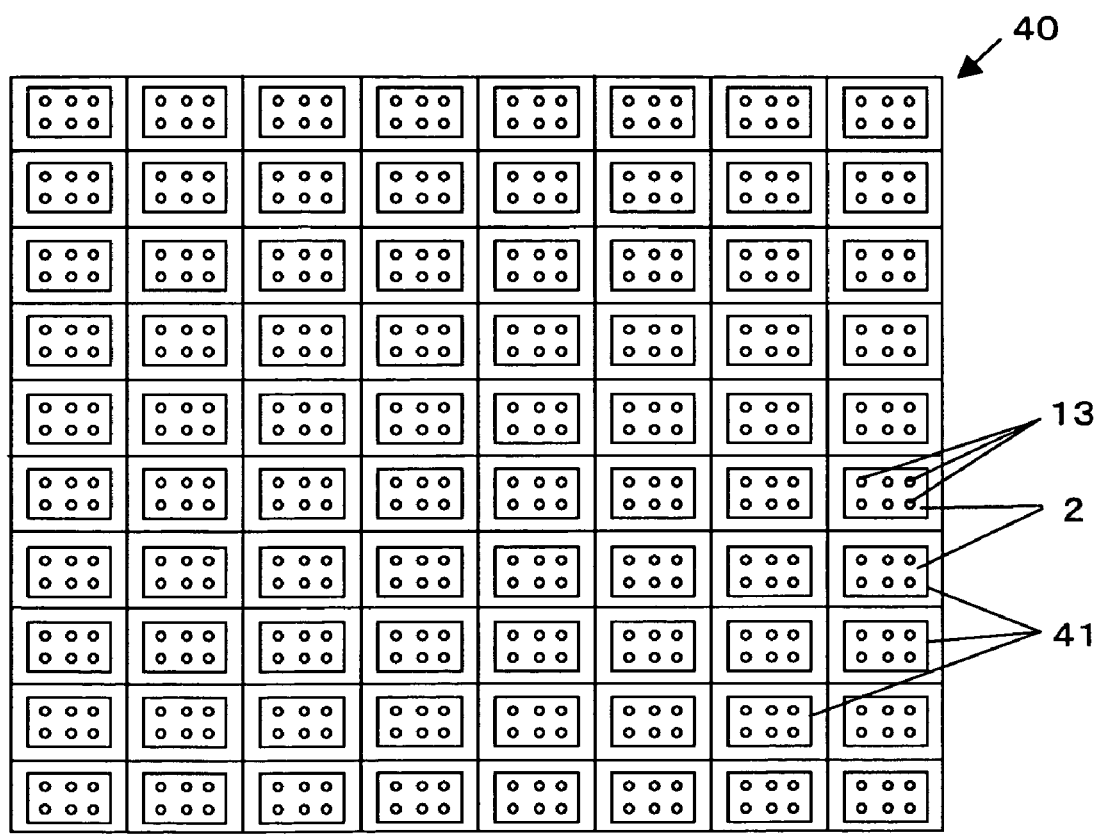
FIG. 18 is a schematic plan view showing stacked semiconductor devices according to Embodiment 1 having been disposed and housed in a tray.

Next, after forming an individual chip, that is, the first semiconductor device 2, a normal test (electrical property test) is carried out. At that time, as shown in FIG. 18, respective chips (first semiconductor devices 2) are housed in housing depressions 41 provided in a matrix state on the upper surface of the tray 40. Since the upper surface and the rear surface of the first semiconductor device 2 are respectively covered with insulating material, the test can be carried out simultaneously as well as in parallel with a probe test. Products having been found to be defective are excluded. In FIG. 18, the protruding electrodes 13a of the first semiconductor devices 2 are displayed schematically. Use of such a tray 40 allows arrangement of products in an array state to make collective testing possible and to make handling of the products easier to improve test efficiency.

In general, in fabricating a semiconductor device, an electrical property test of products (circuits) of respective product forming parts of the semiconductor wafer is performed in a state of a semiconductor wafer. That is, a probe nail is brought into contact with an electrode exposed in respective product forming parts of a semiconductor wafer to perform an electrical property test, and also in the present embodiment, a same probe test may be performed prior to dividing processing so as to perform measurement and a test on quality of products (circuits) of respective product forming parts. The first semiconductor device 2 is fabricated by the above described process.

The third semiconductor device 4 stacked and secured on the first semiconductor device 2 is fabricated by the same steps as in the first semiconductor device 2, that is, respective steps of Step S11 to Step S21 shown in FIG. 4. At that time, the third semiconductor device 4 can be used in a state as shown in FIG. 16 or FIG. 17, that is, so that the protruding electrodes 10a are located on the lower surface or the protruding electrodes 13a are located on the lower surface. Selection thereof is free, but it is necessary to form the protruding electrodes 10a or the protruding electrodes 13a on the lower surface of the third semiconductor device 4 so as to be connectable to the protruding electrodes 10a or the protruding electrodes 13a on the upper surface of the first semiconductor device 2. Since the third semiconductor device to become the middle stage is provided with the bump electrodes engaged in connection in the first semiconductor device 2 at the lower stage side and the second semiconductor device 3 at the upper stage side, the bump electrodes do not have to be provided with intentionally. Therefore, the third semiconductor device 4 may be stacked and secured as shown in the middle stage in FIG. 19 in such a state that no bump electrode is provided. Moreover, the third semiconductor device 4 at the middle stage may be provided with the protruding electrodes either on the upper surface or on the lower surface. In that case, the semiconductor device does not have to be provided in advance with protruding electrodes intentionally on its surface that faces the surface provided with protruding electrodes, and the protruding electrodes provided in the third semiconductor device 4 at the middle stage act as joints.

The second semiconductor device 3 stacked and secured on the upper surface of the third semiconductor device 4 is structured to form either the through-type electrodes 12a or the post electrodes 9a in fabricating the above described first semiconductor device 2. That is, since it will come to the uppermost stage, no outside electrode terminal is necessary on its upper surface.

In Embodiment 1 hereof, as shown in FIG. 4, the second semiconductor device 3 will be described with an example without forming any post electrode but with forming through-type electrodes 12a. In fabricating the second semiconductor device 3, circuit element forming onto the semiconductor substrate (Step S11) is the same but only filling electrodes at the stage for forming a multilayer wiring part are formed in Step S12. Thereafter the process goes forward to Step S14. In this Step S14, only first insulating layer 8a is formed. Since no post electrode is present in Step S15, relationship with post electrodes does not have to be considered, but thickness of the first insulating layer 8a is secured. Subsequent Step S16, Step S17 and Step S18 will be the same processing. In Step S19, protruding electrodes 13b are formed only at the forward ends of the through-type electrodes 12a. Subject to division in Step S20 and a property test in Step S21, the second semiconductor device 3 shown in the uppermost stage in FIG. 19 is formed.

Figure 19:
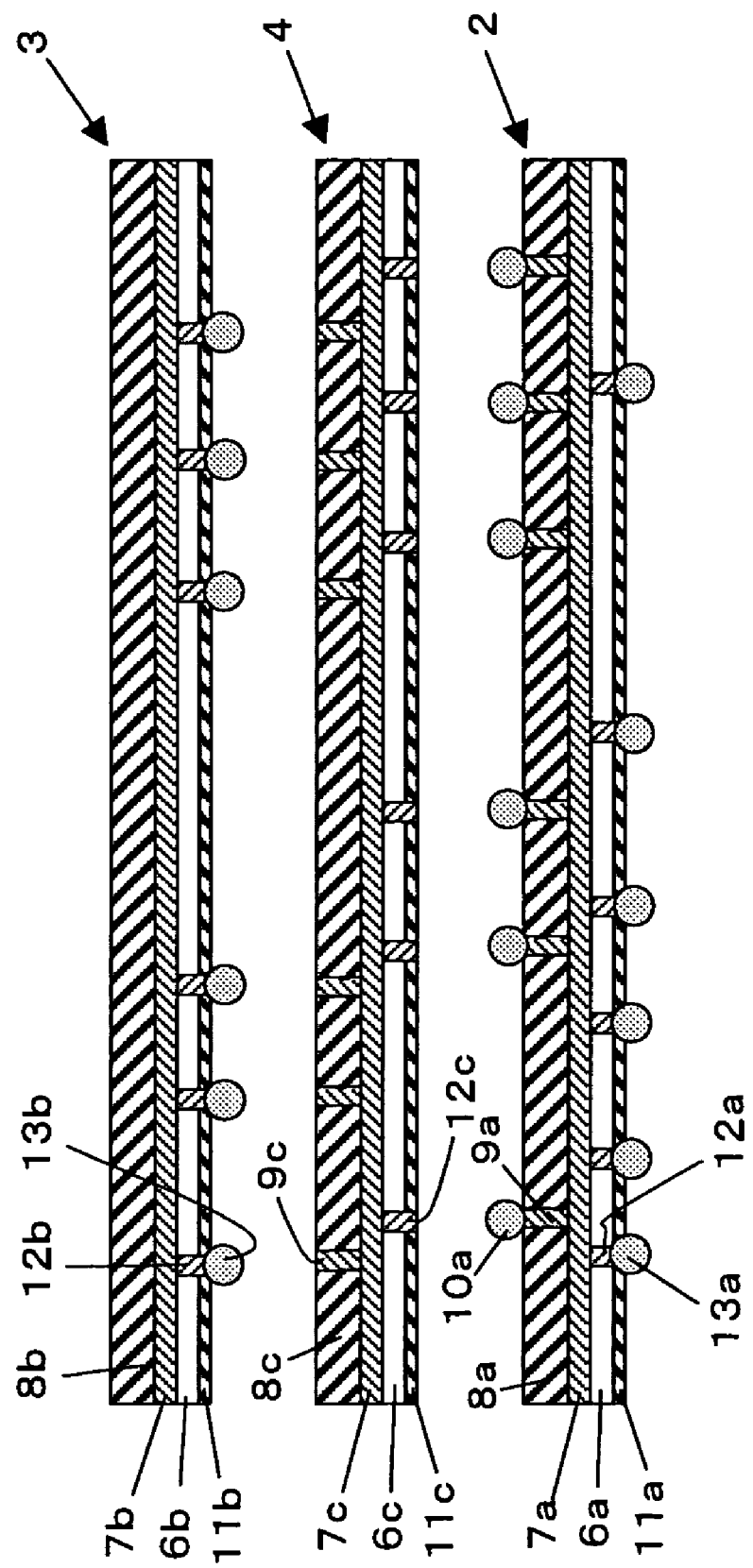
FIG. 19 shows schematic views showing three types of semiconductor devices (first semiconductor device, third semiconductor device and second semiconductor device) having been formed in Embodiment 1 respectively in a laminated order in a separated fashion.
Figure 20:
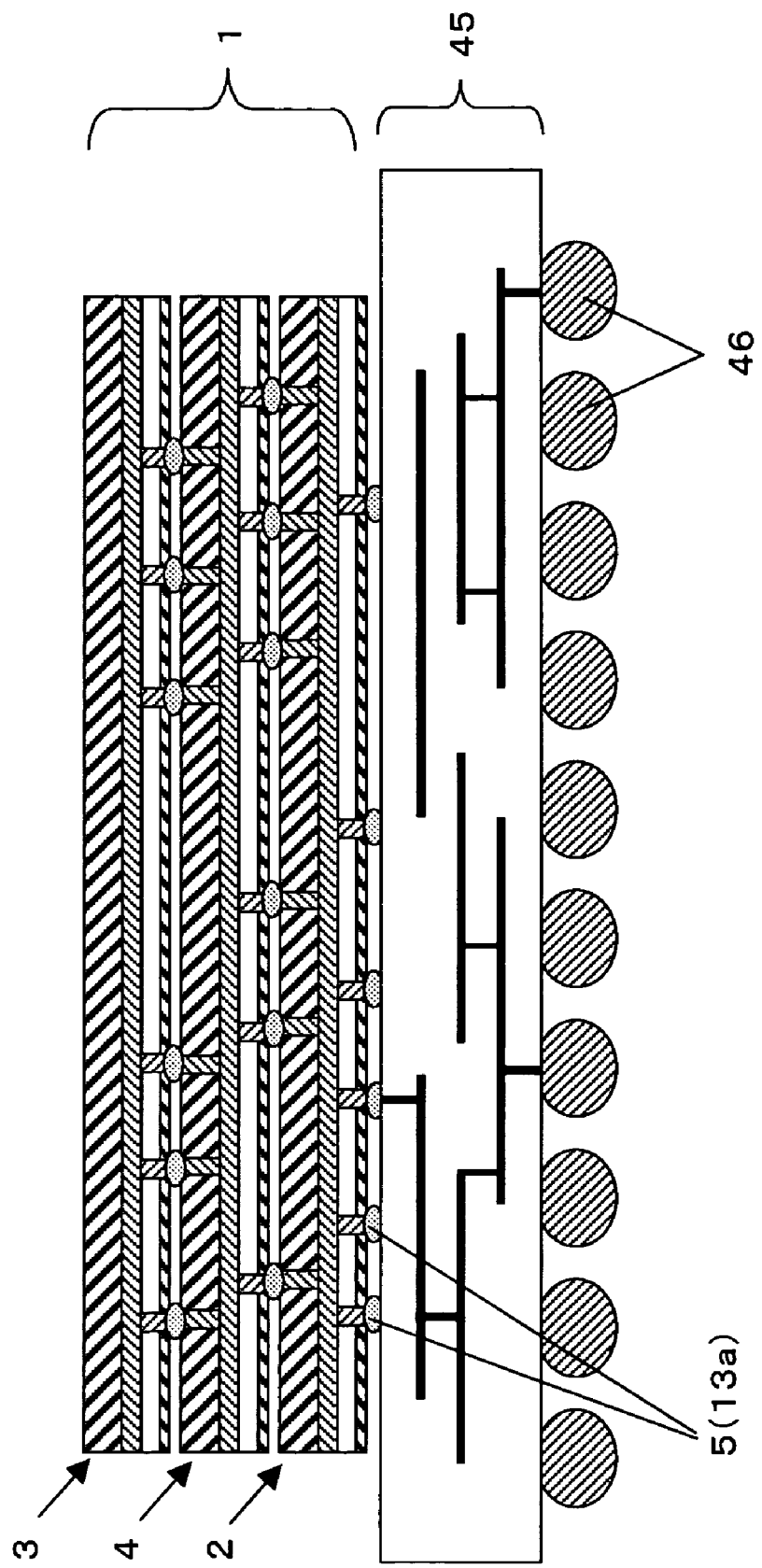
FIG. 20 is a schematic sectional view of a state showing the stacked semiconductor device according to Embodiment 1 having been mounted on a daughter board.

FIG. 19 is a drawing where three types of semiconductor devices (the first semiconductor device 2, the third semiconductor device 4 and the second semiconductor device 3) having been formed in Embodiment 1 are shown in an order of lamination and in a separated fashion. Those three parties of the semiconductor devices 2, 4 and 3 are aligned so that the connecting portions overlap and the protruding electrodes undergo heating and melting temporally through the furnace body and are joined. As for connection in the connecting portions, heat may be locally applied to the connecting portions so as to carry out connection. In Embodiment 1, the connecting portions between the first semiconductor device 2 and the third semiconductor device 4 are protruding electrodes 10a and the through-type electrodes 12c while the connecting portions between the third semiconductor device 4 and the second semiconductor device 3 are the post electrodes 9c and the protruding electrodes 13b. They form a joint. Thus stacked and secured, the stacked semiconductor device 1 shown in FIG. 1 to FIG. 3 can be fabricated. The protruding electrodes 13a on the lower surface of the first semiconductor device 2 at the lowest stage will become outside electrode terminals 5 (see FIG. 1).

FIG. 20 is a schematic sectional view showing amounting state of the stacked semiconductor device 1 fabricated with the process for fabricating the stacked semiconductor device of Embodiment 1 hereof. The stacked semiconductor device 1 is mounted on the upper surface of a daughter board 45 made of a multilayer wiring substrate. The daughter board 45 has a plurality of bump electrodes 46 on its lower surface and on its upper surface there formed is a land which is are not shown in the drawing, though. The disposing pattern of the outside electrode terminals 5 of the stacked semiconductor device 1 corresponds to the disposing pattern of the above described land. Accordingly, reflow of the outside electrode terminals 5 enables the stacked semiconductor device 1 to be mounted onto the daughter board 45.

In Embodiment 1 hereof, fabrication technologies on the stacked semiconductor device 1 have been described, and in consideration as a single product, the first semiconductor device 2 and the third semiconductor device 4 can be shipped respectively as a single product. According to the present invention, those semiconductor devices 2 and 4 are characterized by causing the through-type electrodes and the post electrodes to become electrodes respectively to protrude from the upper and lower surfaces of the semiconductor devices.

Embodiment 1 hereof gives rise to following effects.

(1) In fabricating the stacked semiconductor device 1 formed by stacking and securing the first, second and third semiconductor devices 2, 3 and 4, the first insulating layers 8a, 8b and 8c are formed at the first main surface sides of the semiconductor substrates 6a, 6b and 6c of the respective semiconductor devices 2, 3 and 4 and thereafter the second main surfaces of the semiconductor substrates 6a, 6b and 6c undergo thickness removal by a specified amount, but since the above described first insulating layers 8a, 8b and 8c act as strength members, the semiconductor substrates 6a, 6b and 6c can be made thin to a level of around 5 to 50 μm. Thicknesses of the insulating layers 8a, 8b and 8c can also be made thin to a level of around 20 to 100 μm. Therefore, in the stacked semiconductor device 1 stacked and secured, the bump electrodes will have heights (thicknesses) of around 200 to 380 μm so that the protruding electrodes by means of printing can be made thin to have heights (thicknesses) of around 150 to 330 μm. Therefore, thinning of the semiconductor devices (integrated circuit devices: three-dimensional integrated circuit devices) of the multilayer stacked structure can be planned.

(2) In the first, the third and the second stacked semiconductor devices, in connecting the semiconductor device at the lower stage side with the semiconductor device at the upper stage side, connection is carried out in utilization of post electrodes to become columnar provided by piercing through the first insulating layer and through-type electrodes to become columnar provided by piercing through the semiconductor substrate, and therefore, the current pathway will get short to make reduction in inductance attainable and to make electrical property of the stacked semiconductor device 1 good. The post electrodes and through-type electrodes provided in the first insulating layer and semiconductor substrate are short with length (thickness) thereof being around 20 to 100 μm or 5 to 50 μm, and will become sufficiently short compared with length of not less than several hundred micrometers of a bonding wire by means of wire connection. Thereby, high speed operation of the stacked semiconductor device 1 will become feasible.

(3) There is a constraint that the through-type electrodes provided in the semiconductor substrate is formed in a region apart from the region where circuit elements are formed, and nevertheless disposing locations for wiring regions and the like can be selected comparatively freely. The disposing location for the post electrodes connected with specified wiring of the multilayer wiring part can be determined comparatively freely by deploying wiring. Therefore, selecting locations to provide the through-type electrodes and the post electrodes, improvement in integration density in the two-dimensional direction can be planned.

(4) The stacked semiconductor device 1 of Embodiment 1 hereof will become capable of electrically connecting the semiconductor device at the lower stage side with the semiconductor device at the upper stage side without using any interposer. Consequently, reduction in the number of assembling parts items can be planned and thinning of the stacked semiconductor device can be planned. Use of interposer will lengthen connecting path (current pathway) between semiconductor chips or between semiconductor devices, but no use of interposer will enable the current pathway to get short so that improvement in electrical property can be planned.

(5) In fabricating the stacked semiconductor device 1 of Embodiment 1 hereof, the first, the third and the second semiconductor devices 2, 4, and 3 are fabricated in use of the semiconductor substrates 6a, 6c and 6b, and the semiconductor substrates 6a, 6c and 6b together with the insulating layers are cut at the final stage to fabricate the first, the third and the second semiconductor devices 2, 4 and 3. Accordingly, since required processing other than stacking and securing the first, the third and the second semiconductor devices 2, 4 and 3 is carried out on a wafer level, handling performance is good throughout the steps and wasteful work will get less. Consequently, reduction in production costs can be planned.

(6) In fabricating the stacked semiconductor device 1 of Embodiment 1 hereof, at the stage before the three semiconductor devices 2, 4 and 3 are stacked and secured, all processing is implemented on a wafer level, and therefore, the process is simplified so as to increase productivity and reduction in fabrication costs of the stacked semiconductor device 1 can be attained.

(7) According to the process for fabricating the stacked semiconductor device of Embodiment 1 hereof, just planning correspondence of the connecting portions of the semiconductor devices to be vertically overlapped enables the semiconductor devices to be stacked into further abundance of layers, and therefore the stacked semiconductor device 1 undergoing further sophisticated integration can be fabricated.

(8) In the stacked semiconductor device 1 of Embodiment 1 hereof, in the structure thereof, as in the above described article (7), except a constraint of planning correspondence of the connecting portions of the semiconductor devices to be vertically overlapped, the circuits formed in respective semiconductor devices can be designed freely. That is, taking the above described constraint as one of designing tools, the stacked semiconductor device 1 can be designed as if it were one chip. In the current designing tools, only such a designing tool is present in assumption of one chip LSI (corresponding to each semiconductor device of Embodiment 1 hereof).

Under the circumstances, in designing System in Package, simulating what kind of circuit is appropriate for each semiconductor device subject to determination based on performance, costs, simplicity of the test and the like and allocating respective semiconductor devices based on that simulation outcome, the stacked semiconductor device 1 excellent in electric property and high speed operation performance can be fabricated in compact, thin and inexpensive fashion.

(9) The first semiconductor device 2 and the third semiconductor device 4 being single product are structured to cause the through-type electrodes and the post electrodes, that will become electrodes respectively, to protrude from the upper and the lower surface of the semiconductor devices. Due to the above described articles (1) to (3) and articles (5) to (6) deriving from this characteristic and due to simplification of the process, thinning, high speed operation and improvement in density of integration in the two-dimensional direction can be planned even for the single semiconductor device, and reduction in cost for fabrication thereof can be planned due to fabrication in a state of a wafer.

Embodiment 2

Figure 21:
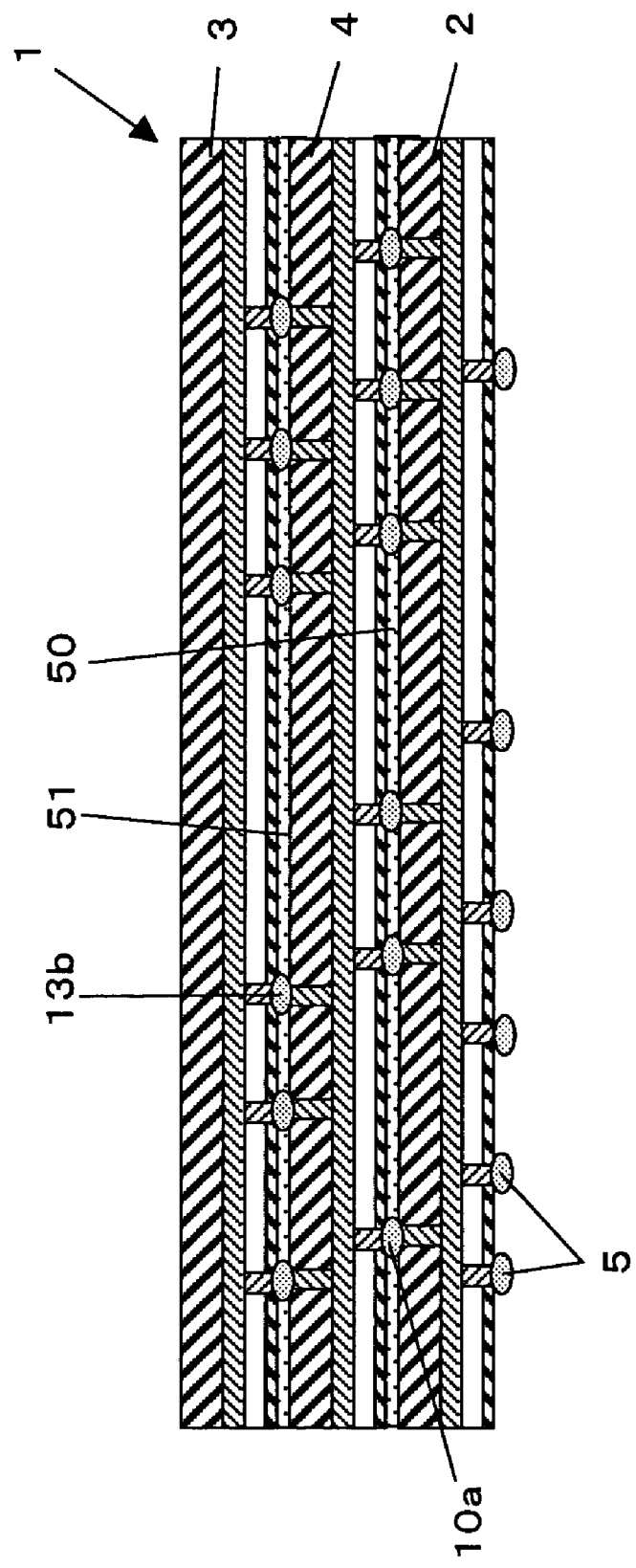
FIG. 21 is a schematic sectional view of a stacked semiconductor device being Embodiment 2 of the present invention.

FIG. 21 is a schematic sectional view of a stacked semiconductor device being Embodiment 2 of the present invention. Embodiment 2 hereof is configured, in the stacked semiconductor device 1 of Embodiment 1, to fill a gap between the first semiconductor device 2 and the third semiconductor device 4 as well as a gap between the third semiconductor device 4 and the second semiconductor device 3 with insulating resin to form underfill layers 50 and 51. With those underfill layers 50 and 51, the gaps are filled and therefore short defects due to incorporation of foreign substance and the like can be prevented. Polyimide resin, for example, as insulating resin is caused to fill the gaps in a vacuum atmosphere and thereafter is hardened subject to bake processing.

Embodiment 3

Figure 22:
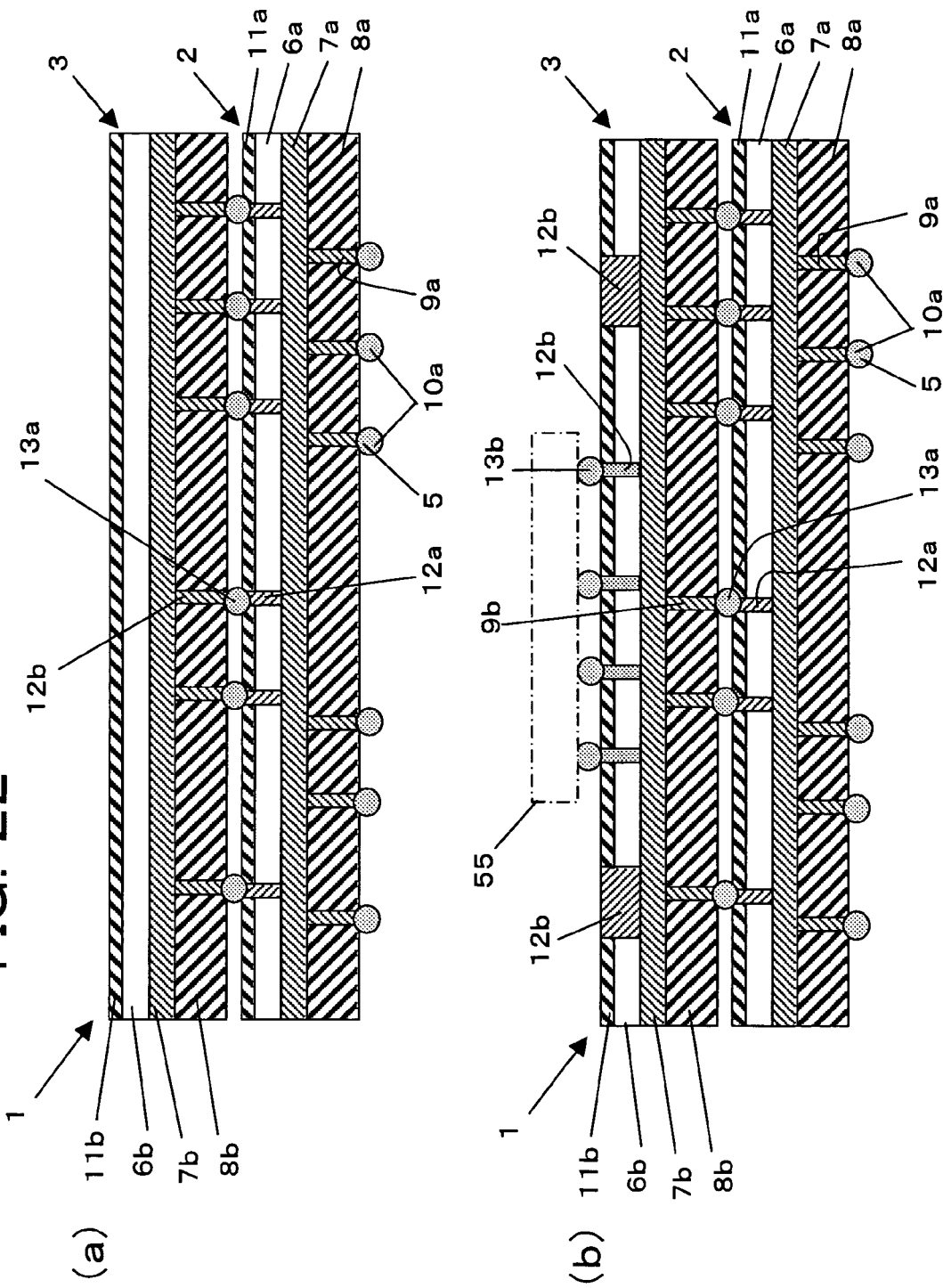
FIG. 22 shows schematic sectional views of a stacked semiconductor device with two-layer lamination being Embodiment 3 of the present invention.

FIG. 22(a) and FIG. 22(b) show schematic sectional views of a stacked semiconductor device 1 of a two-stage stacked and secured type being Embodiment 3 of the present invention. In both of FIG. 22(a) and FIG. 22(b), the semiconductor substrates 6a and 6b disposed upper and the first insulating layers 8a and 8b disposed lower have been stacked and secured. In any of them, the protruding electrodes 10a on the lower surface of the first semiconductor device 2 will become outside electrode terminals 5. The protruding electrodes 13a on the upper surface of the first semiconductor device 2 will become joints so that the second semiconductor device 3 is stacked and secured. That is, the protruding electrodes 13a attached to the through-type electrodes 12a at the upper surface side of the first semiconductor device 2 are structured to be connected to the post electrodes 9b in the lower surface of the second semiconductor device 3.

In FIG. 22(a), the second semiconductor device 3 is structured so that no electrode is exposed at its upper surface side, that is, is structured so that the semiconductor substrate 6b is provided with no through-type electrode 12b.

In contrast, in FIG. 22(b), the semiconductor substrate 6b at the upper surface side of the second semiconductor device 3 is provided with through-type electrodes 12b. The through-type electrodes 12b are structured to have diameter of the same level as the through-type electrode 12b in case of Embodiment 1 and thick through-type electrodes 12b shown at the both end sides in the drawing. The thick through-type electrodes 12b have diameter of the same level as the electrode pad as described with reference to FIG. 10, and, for example, can be connected with wires. That is, they can be connected with the pads of a daughter board with electrically conductive wires.

In contrast, a plurality of thin through-type electrodes 12b as those in Embodiment 1 are configured, for example, to be connected to one end of the electrode plate 55 connected to the ground of the daughter board. According to the present embodiment, due to a structure to expose the through-type electrodes 12b in the upper surface of the second semiconductor device 3 at the upper stage, the degree of allowance for circuit designing (implementation designing) inclusive of the daughter board increases.

In the present embodiment, active elements (active parts) such as chip resistors, chip capacitors, chip inductor and the like may be mounted at the upper surface side of the second semiconductor device 3. Electrodes of respective active elements are electrically connected with the through-type electrodes 12b. Such configuration will increase the integration level.

Embodiment 4

Figure 23:
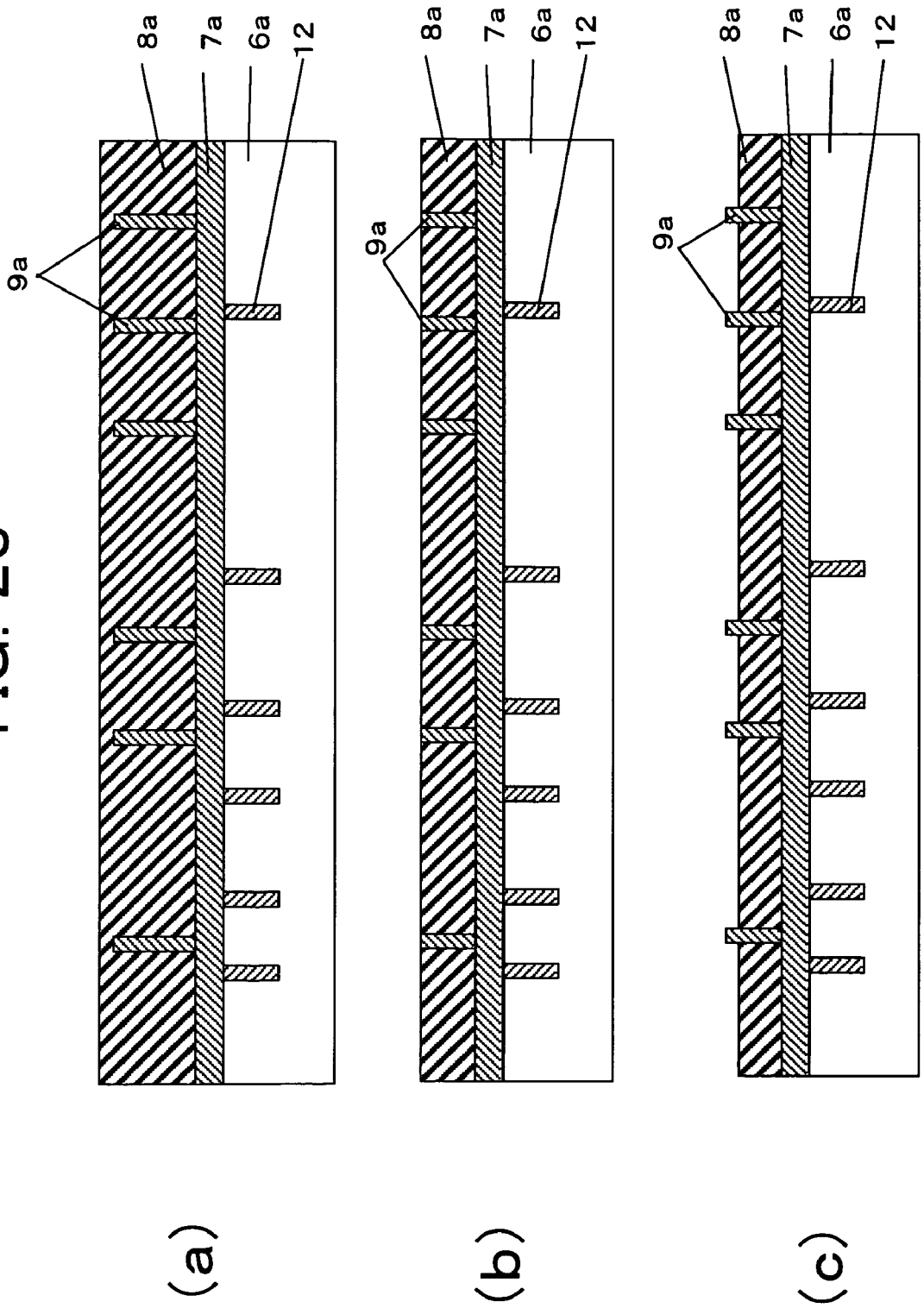
FIG. 23 shows sectional views of respective steps showing a part of a process for fabricating a stacked semiconductor device being Embodiment 4 of the present invention.
Figure 24:
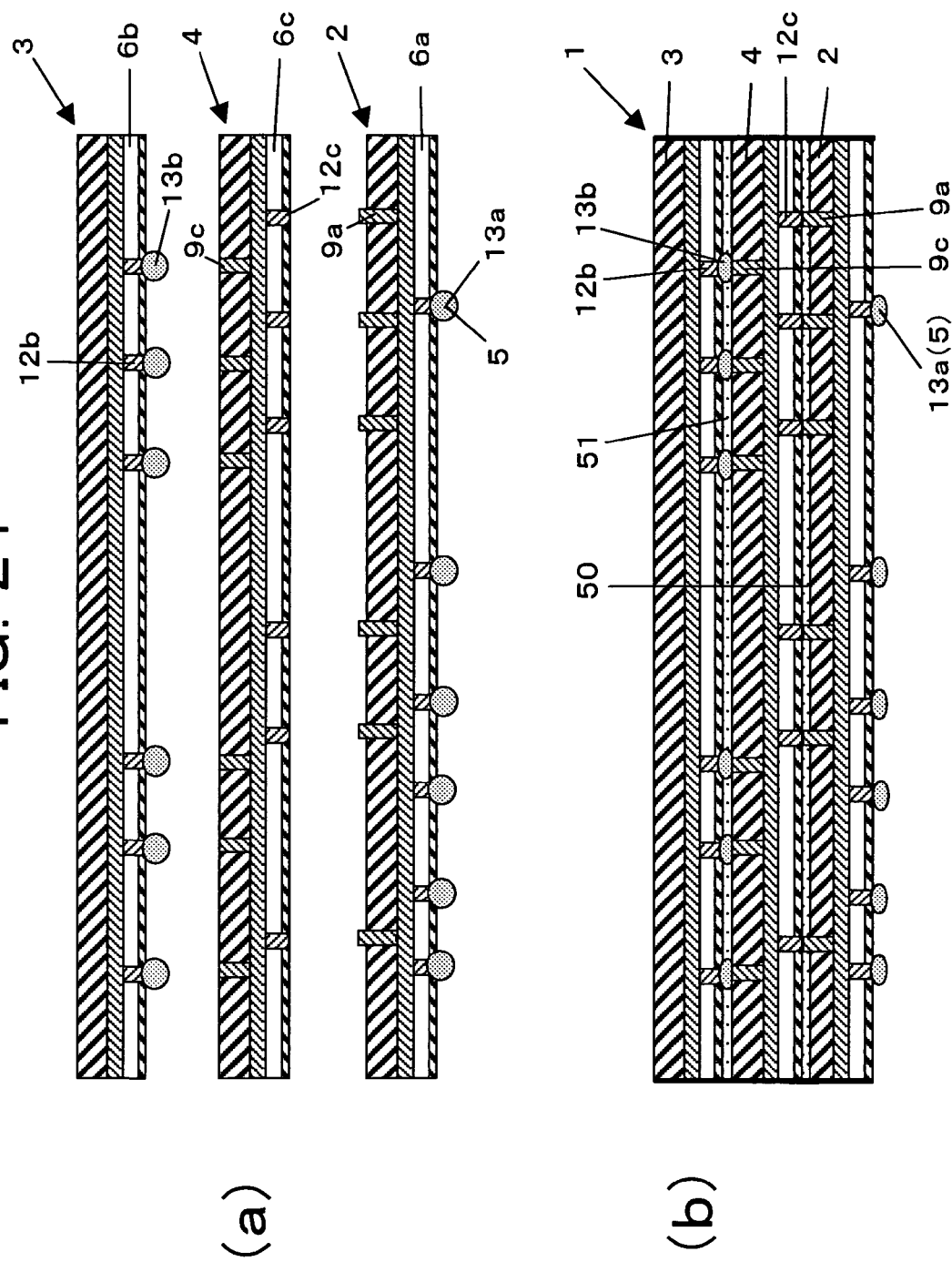
FIG. 24 shows sectional views of respective steps showing a part of a process for fabricating a stacked semiconductor device being Embodiment 4 of the present invention.

FIG. 23 and FIG. 24 are drawings related to a process for fabricating stacked semiconductor device being Embodiment 4 of the present invention. In Embodiment 4 hereof, substantially likewise the case of Embodiment 1, the stacked semiconductor device 1 is fabricated through stages of Step S11 to Step S22, but the first semiconductor device 2 is connected with the third semiconductor device 4 with inter-metal joint by means of ultrasonic oscillation without using any protruding electrode. Therefore, a portion thereof is different in fabrication.

As shown in FIG. 23(a), in fabricating the first semiconductor device 2, after the post electrodes 9a provided at the first main surface side of the semiconductor substrate 6a are covered with the first insulating layer 8a, primary hardening processing to implement processing of hardening resin insufficiently is implemented at the time of hardening processing (cure) of the first insulating layer 8a.

Next, as shown in FIG. 23(b), the surface of the first insulating layer 8a is ground by specified thickness and is removed so as to expose the post electrode 9a.

As shown in FIG. 23(c), such secondary hardening processing (cure) that the first insulating layer 8a accompanies hardening contraction is implemented to expose forward ends of the post electrodes 9a on the surface of the first insulating layer 8a. For example, length of protrusion is around 10 μm. That protrusion length is length required for implementing inter-metal joint by means of ultrasonic oscillation effectively.

Next, the first semiconductor device 2, the third semiconductor device 4 and the second semiconductor device 3 undergo positioning and are stacked. FIG. 24(a) shows an order of lamination, and is a drawing in which the first semiconductor device 2 is positioned in the lowest layer, the third semiconductor device 4 is positioned thereabove, and the second semiconductor device 3 is positioned apart thereon.

There, nothing is shown in particular in the drawing, but the third semiconductor device 4 undergoes positioning and is disposed on the first semiconductor device 2, and the post electrodes 9a made of Cu on the upper surface of the first semiconductor device 2 are rubbed to the through-type electrodes 12c made of Cu on the lower surface of the third semiconductor device 4 by relatively applying ultrasonic oscillation so that rubbed surfaces between the post electrodes 9a and through-type electrodes 12c are connected by inter-metal joint (metal joint). Thereafter, the second semiconductor device 3 is stacked and secured on the third semiconductor device 4 by the same process as in Embodiment 1 to fabricate the stacked semiconductor device 1 as shown in FIG. 24(*b*).

In this example, the gap between the first semiconductor device 2 and the third semiconductor device 4 is filled with an insulating underfill layer 50 and the gap between the third semiconductor device 4 and the second semiconductor device 3 is filled with an insulating underfill layer 51.

The present embodiment is characterized in that, when the first semiconductor device 2 and the third semiconductor device 4 are stacked and secured, no protruding electrode is used, and therefore further thinning processing can be planned.

Embodiment 5

FIG. 25(*a*) and FIG. 25(*b*) show sectional views of respective steps showing a part of a process for fabricating a stacked semiconductor device being Embodiment 5 of the present invention. Embodiment 5 hereof is an example of stacking and securing with metal joint likewise Embodiment 4. In this example, after the third semiconductor device 4 is stacked and secured onto the first semiconductor device 2 by metal joint, the third semiconductor device 4 is stacked and secured onto the third semiconductor device 4 by metal joint. In the present embodiment, likewise Embodiment 4, at the time of fabricating the first semiconductor device 2 and the third semiconductor device 4, the forward ends of the post electrodes 9*a* and 9*c* of the first semiconductor device 2 and the third semiconductor device 4 are caused to protrude from the surface of the first insulating layers 8*a* and 8*c* by around 10 µm.

FIG. 25(*a*) shows an order of lamination, and is a drawing in which the first semiconductor device 2 is positioned in the lowest layer, the third semiconductor device 4 is positioned thereabove, and the second semiconductor device 3 is positioned apart thereon.

There, nothing is shown in particular in the drawing, but the third semiconductor device 4 undergoes positioning and is disposed on the first semiconductor device 2, and the post electrodes 9*a* made of Cu on the upper surface of the first semiconductor device 2 are rubbed to the through-type electrodes 12*c* made of Cu on the lower surface of the third semiconductor device 4 by relatively applying ultrasonic oscillation so that rubbed surfaces between the post electrodes 9*a* and through-type electrodes 12*c* are connected by inter-metal joint (metal joint).

Next, likewise, nothing is shown in particular in the drawing, but the second semiconductor device 3 undergoes positioning and is disposed on the third semiconductor device 4, and the post electrodes 9*c* made of Cu on the upper surface of the third semiconductor device 4 are rubbed to the through-type electrodes 12*b* made of Cu on the lower surface of the second semiconductor device 3 by relatively applying ultrasonic oscillation so that rubbed surfaces between the post electrodes 9*c* and through-type electrodes 12*b* are connected by inter-metal joint (metal joint).

In this example, the gap between the first semiconductor device 2 and the third semiconductor device 4 is filled with an insulating underfill layer 50 and the gap between the third semiconductor device 4 and the second semiconductor device 3 is filled with an insulating underfill layer 51.

The present embodiment is characterized in that, when the first semiconductor device 2 and the third semiconductor device 4 are stacked and secured and the third semiconductor device 4 and the second semiconductor device 3 are stacked and secured, no protruding electrode is used, and therefore further thinning processing can be planned.

Embodiment 6

Figure 26:
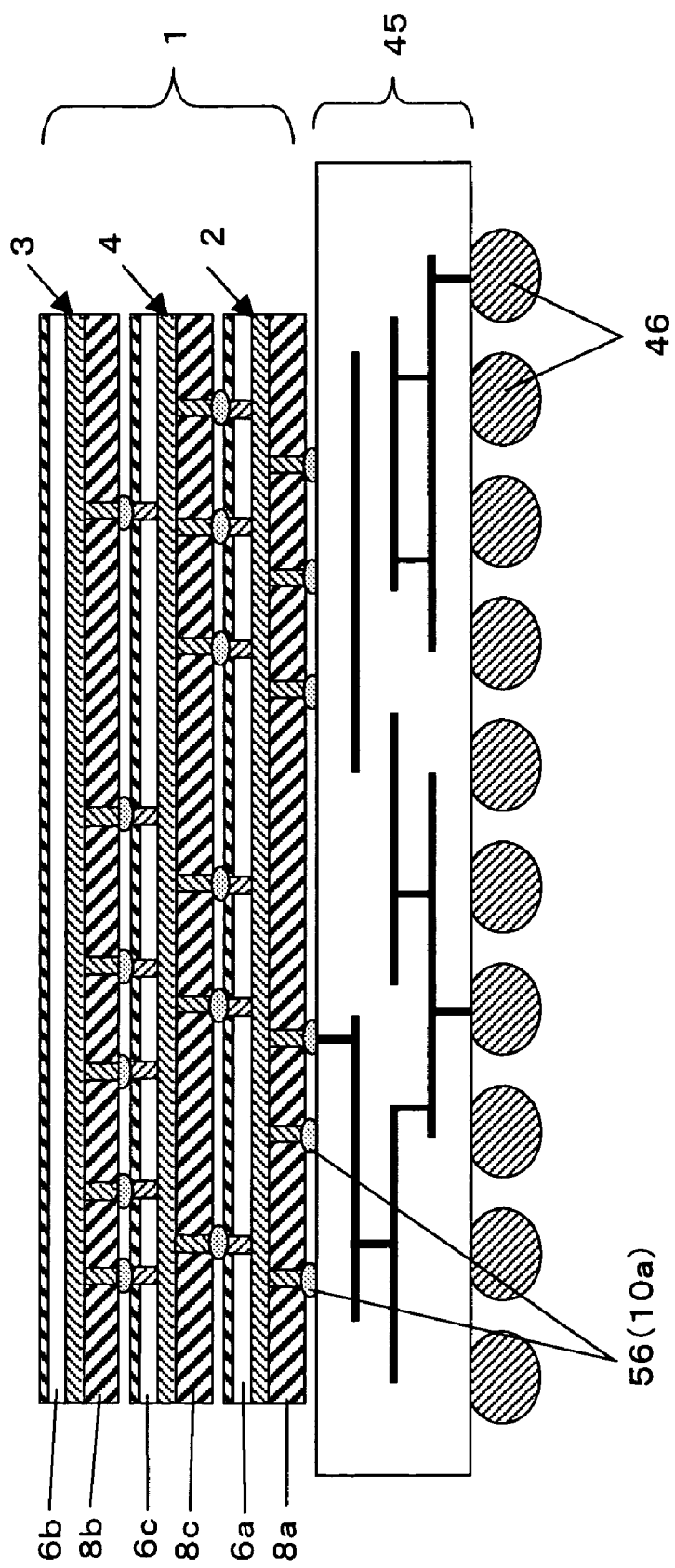
FIG. 26 is a schematic sectional view of a state showing the stacked semiconductor device according to Embodiment 6 of the present invention having been mounted on a daughter board.

FIG. 26 is a schematic sectional view of a state showing the stacked semiconductor device according to Embodiment 6 of the present invention having been mounted in a daughter board. In Embodiment 6 hereof, the first semiconductor device 2, the second semiconductor device 3 and the third semiconductor device 4 of the stacked semiconductor device 1 are stacked and secured in such a state that any of the semiconductor substrates 6*a*, 6*b* and 6*c* is located at the upper surface side and the first insulating layers 8*a*, 8*b* and 8*c* are located at the lower surface side. And the first semiconductor device 2 is mounted onto the daughter board 45 by connecting the protruding electrodes 10*a* of the first semiconductor device 2 with lands not shown in the drawing of the daughter board 45.

Embodiment 7

Figure 27:
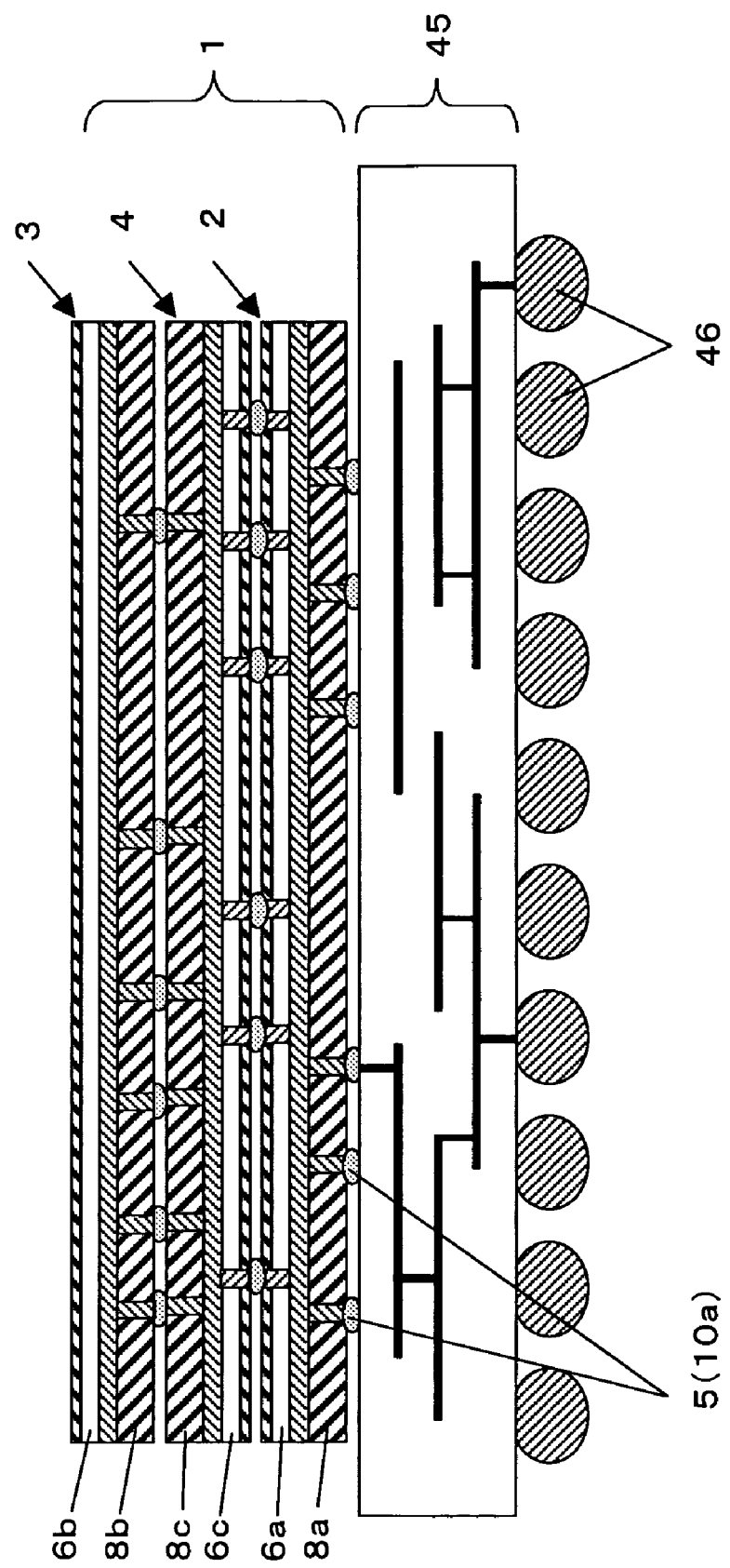
FIG. 27 is a schematic sectional view of a state showing the stacked semiconductor device according to Embodiment 7 of the present invention having been mounted on a daughter board.

FIG. 27 is a schematic sectional view of a state showing the stacked semiconductor device according to Embodiment 7 of the present invention having been mounted in a daughter board. The present embodiment is a mixed type with the first semiconductor device 2 and the second semiconductor device 3 of the stacked semiconductor device 1 being stacked and secured in such a state that the semiconductor substrates 6*a* and 6*b* are located at the upper surface side and the first insulating layers 8*a* and 8*b* are located at the lower surface side, and for the third semiconductor device 4, being stacked and secured in such a state that the semiconductor substrate 6*c* is located at the lower surface side and the first insulating layer 8*c* is located at the upper surface side. And the first semiconductor device 2 is mounted onto the daughter board 45 by connecting the protruding electrodes 10*a* of the first semiconductor device 2 with lands not shown in the drawing of the daughter board 45.

Embodiment 8

Figure 28:
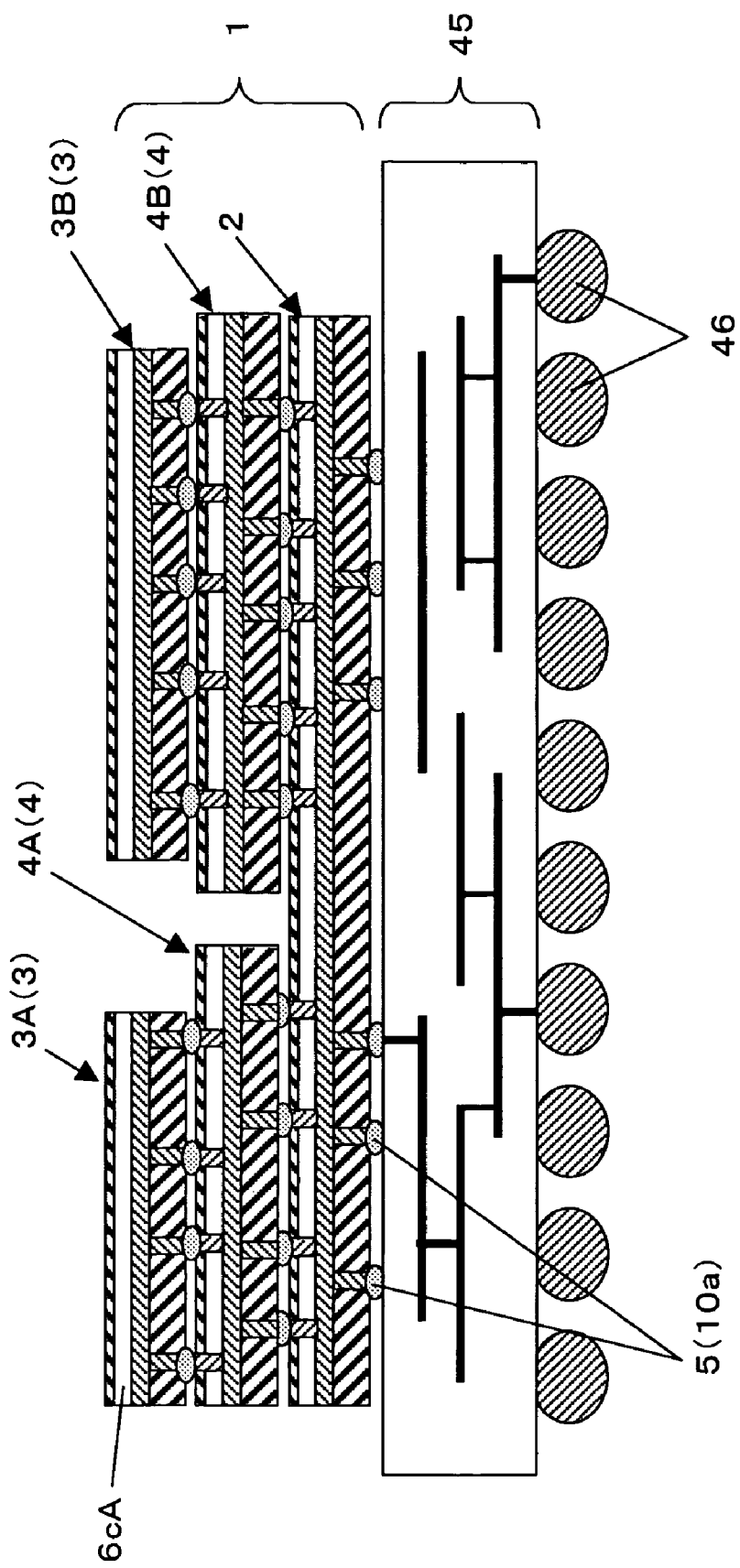
FIG. 28 is a schematic sectional view of a state showing the stacked semiconductor device according to Embodiment 8 of the present invention having been mounted on a daughter board.

FIG. 28 is a schematic sectional view of a state showing the stacked semiconductor device according to Embodiment 8 of the present invention having been mounted on a daughter board. Embodiment 8 hereof is structured so that a plurality of semiconductor devices 4A and 4B being the middle stage third semiconductor devices 4 smaller than the first semiconductor device 2 are disposed and secured in parallel on the first semiconductor device 2, and semiconductor devices 3A and 3B to become the second semiconductor devices 3 are stacked and secured respectively on those semiconductor devices 4A and 4B. That is, in Embodiment 8 hereof, a great number of middle stage third semiconductor devices 4 are disposed in parallel in plurality on the first semiconductor device 2 with the largest area, and, moreover, the upper stage second semiconductor devices 3 are stacked and secured respectively on those third semiconductor devices 4. The middle stage third semiconductor device may consist of a plurality of stages to be stacked and secured between the lower stage first semiconductor device and the upper stage second semiconductor device so as to further improve integration level.

In Embodiment 8 hereof, among the above described first to third semiconductor devices, the above described semiconductor substrate of one semiconductor device is a silicon substrate and the above described semiconductor substrate of another semiconductor device is a compound semiconductor substrate. And circuit elements suitable for respective semiconductor substrates are formed. For example, the semiconductor substrate 6a of the first semiconductor device 2 is a silicon substrate and the semiconductor substrate 6cA of the semiconductor device 3A is a compound semiconductor (for example, a GaAs substrate). The semiconductors at the middle stage and the upper stage, almost all the symbols will be omitted. However, in necessity for descriptions, the middle stage third semiconductor devices 4A and 4B will be provided with A or B at the ends for depiction. The upper stage second semiconductor devices 3A and 3B will be provided with A or B at the ends for depiction.

In Embodiment 8, semiconductor devices are designated for all parts to be incorporated in the stacked semiconductor device 1, but the other electronic parts may be stacked and secured. For example, chip parts such as resistors, capacitors and the like, MEMS (Micro electro Mechanical System), biochips and the like may be stacked and secured. Silicon substrates as semiconductor substrates and compound semiconductor substrates as semiconductor substrate may be present more in number.

According to Embodiment 8 hereof, further intensive integration is attained.

Embodiment 9

Figure 29:
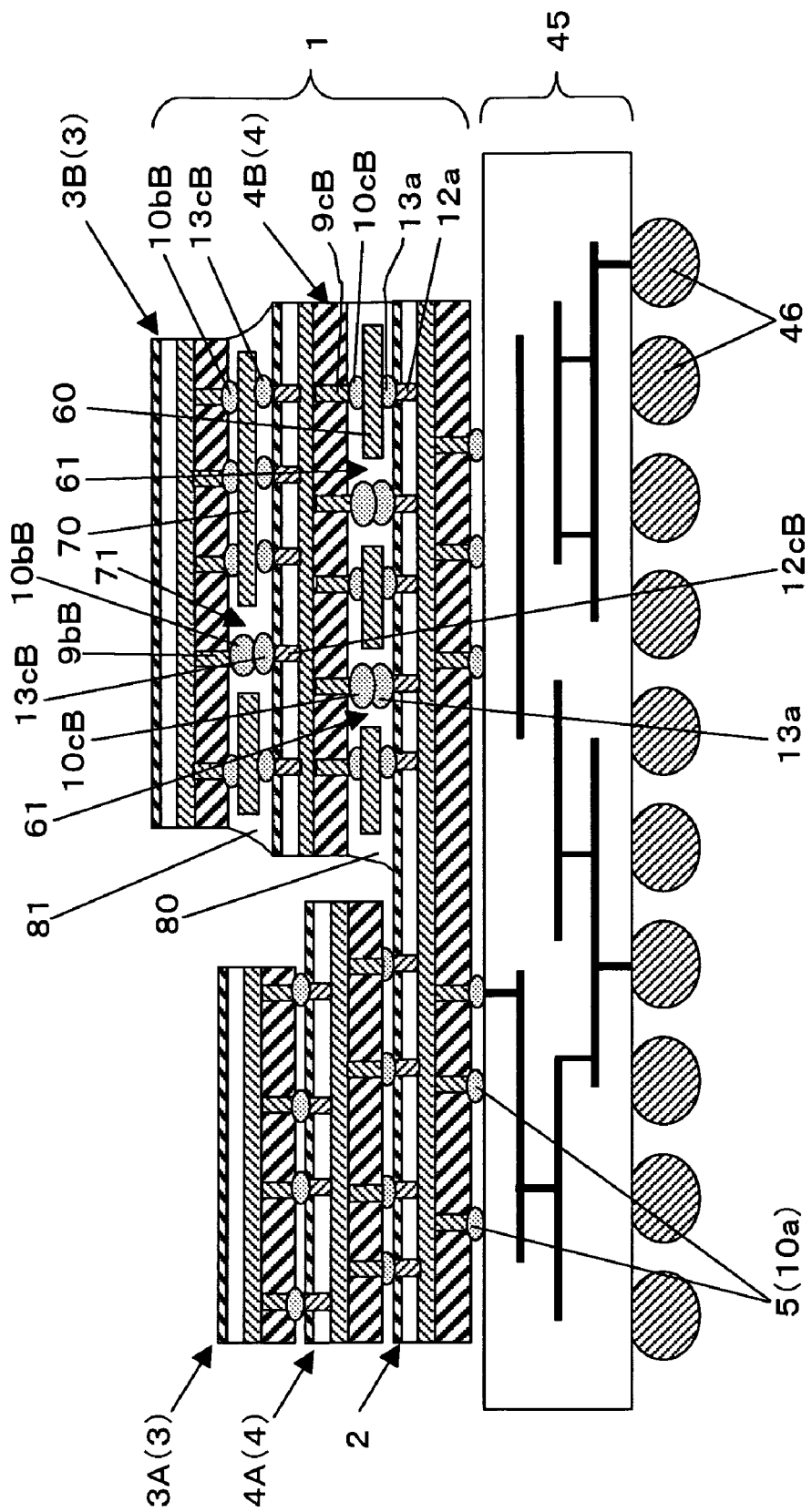
FIG. 29 is a schematic sectional view of a state showing the stacked semiconductor device according to Embodiment 9 of the present invention having been mounted on a daughter board.

FIG. 29 is a schematic sectional view of a state showing the stacked semiconductor device according to Embodiment 9 of the present invention having been mounted on a daughter board. Embodiment 9 hereof is an example in which, in Embodiment 8, a metal plate 60 is sandwiched between the first semiconductor device 2 and the semiconductor device 4B thereabove and a metal plate 70 is sandwiched between the semiconductor device 4B and the semiconductor device 3B. Circuitwise, for example, the metal plate 70 is configured to be given the ground potential and the metal plate 60 is configured to be given the power supply potential (reference potential) such as Vcc and the like.

That is, the metal plate 60 having insulating holes 61 is present between the first semiconductor device 2 and the semiconductor device 4B. In the portion of the insulating holes 61, the through-type electrodes 12a on the upper surface of the first semiconductor device 2 are electrically connected with the post electrodes 9cB on the lower surface of the semiconductor device 4B through the protruding electrodes 13a and the protruding electrodes 10cB in a state without contacting the metal plate 60.

The through-type electrodes 12a of the first semiconductor device 2 and the semiconductor device 4B to face the metal plate 60 are electrically connected with the post electrodes 9cB on the lower surface of the semiconductor device 4B through the protruding electrodes 13a and the protruding electrodes 10cB. Since inter position of the metal plate 60 lengthens the distance between the through-type electrodes 12a and the post electrodes 9cB, the protruding electrodes 13a and the protruding electrodes 10cB used for connection in the portion of the insulating holes 61 are made larger than the protruding electrodes 13a and the protruding electrodes 10cB connected to the metal plate 60.

In addition, the metal plate 70 having insulating holes 71 is present between the semiconductor device 4B and the semiconductor device 3B as well. In the portion of the insulating holes 71, the through-type electrodes 12bB on the upper surface of the semiconductor device 4B are electrically connected with the post electrodes 9bB on the lower surface of the semiconductor device 3B through the protruding electrodes 13cB and the protruding electrodes 10bB in a state without contacting the metal plate 70. The through-type electrodes 12cB of the semiconductor device 4B and the post electrodes 9bB of the semiconductor device 3B to face the metal plate 70 are brought into electrical connection through the protruding electrodes 13cB and the protruding electrodes 10bB. Since interposition of the metal plate 70 lengthens the distance between the through-type electrodes 12cB and the post electrodes 9bB, the protruding electrodes 13cB and the protruding electrodes 10bB used for connection in the portion of the insulating holes 71 are made larger than the protruding electrodes 13cB and the protruding electrodes 10bB connected to the metal plate 70.

The gap between the first semiconductor device 2 and the semiconductor device 4B is filled with an underfill layer 80 and the gap between the semiconductor device 4B and the semiconductor device 3B is filled with an underfill layer 81.

According to Embodiment 9 hereof, presence of the metal plate 70 given the ground potential and the metal plate 60 given the power supply potential (reference potential) such as Vcc and the like stabilizes the power supply as well as the ground of the stacked semiconductor device 1, and consequently stabilizes operations and can derive good electrical property.

So far, the invention attained by the present inventor has been described in particular based on embodiments, and nevertheless the present invention will not be limited to the above described embodiments, but it goes without saying that various changes can be made without departing the gist thereof. In the embodiments, the post electrodes have been formed with plating but may be formed with stud bumps. Stud bumping is a system of connecting a gold wire with an electrode pad with a thermo compression method (ball bonding method) to form a nail head, and thereafter cutting the wire in the base portion of that nail head to form protruding electrodes which are stacked in many stages.

INDUSTRIAL APPLICABILITY

As described above, the stacked semiconductor device related to the present invention can be used as a thin three-dimensional integrated circuit device suitable for high speed operation. In addition, the stacked semiconductor device related to the present invention allows allocation of respective semiconductor devices in the stacked semiconductor device subject to simulation based on determination on performance, costs, simplicity of the test and the like in designing System in Package. Therefore, according to the present invention, the stacked semiconductor device being excellent in electric property and high speed operation performance and to become compact and thin and inexpensive can be provided.

The invention claimed:

1. A stacked semiconductor device consisting of a first semiconductor device having outside electrode terminals on a lower surface thereof, a second semiconductor device electrically connected with said first semiconductor device and secured on said first semiconductor device, said first semiconductor device comprising:

a first semiconductor substrate;

first circuit elements at a first main surface of said first semiconductor substrate;

a first multilayer wiring part on said first circuit elements and configured of a first wiring electrically connected with said first circuit elements and a first insulating material layer, the first wiring and the first insulating material layer being stacked alternately with the first insulating material layer being an uppermost layer;

a first insulating layer for covering said first insulating material layer of said first multilayer wiring part and provided over the first main surface of said first semiconductor substrate, said first insulating layer is a support member of said first semiconductor substrate;

a second insulating layer for covering a second main surface of said first semiconductor substrate that is opposite the first main surface of said first semiconductor substrate, wherein the first insulating layer has greater thickness than the second insulating layer;

a plurality of first post electrodes on said first wiring of said first multilayer wiring part and each having a top surface and side surfaces, the top surfaces of said first post electrodes exposed from a surface of said first insulating layer and all the side surfaces of said first post electrodes covered by said first insulating layer;

a plurality of first through-type electrodes penetrating from a specified depth of said first multilayer wiring part to a surface of said second insulating layer through said first semiconductor substrate, said first through-type electrodes insulating from said first semiconductor substrate by a first insulating film and connected with said first wiring of said first multilayer wiring part; and said outside electrode terminals connected to said first through-type electrodes, said second semiconductor device comprising a second semiconductor substrate;

second circuit elements formed at a first main surface of said second semiconductor substrate;

a second multilayer wiring part on said second circuit elements and configured of a second wiring electrically connected with said second circuit elements and a second insulating material layer, the second wiring and the second insulating material layer being stacked alternately with the second insulating material layer being an uppermost layer;

a third insulating layer for covering said second insulating material layer of said second multilayer wiring part and provided over the first main surface of said second semiconductor substrate, said third insulating layer is a support member of said second semiconductor substrate;

a fourth insulating layer for covering a second main surface of said second semiconductor substrate that is opposite the first main surface of said second semiconductor substrate;

wherein the third insulating layer has greater thickness than the fourth insulating layer; and at least second post electrodes on said second wiring of said second multilayer wiring part and each having a top surface and side surfaces, the top surfaces of said second post electrodes exposed from a surface of said third insulating layer and all the side surfaces of the second post electrodes covered by said third insulating layer, or a plurality of second through-type electrodes penetrating from a specified depth of said second multilayer wiring part to a surface of said fourth insulating layer through said second semiconductor substrate, said second through-type electrodes insulated from said second semiconductor substrate by a second insulating film and connected with said second wiring of said second multilayer wiring part, in said first semiconductor device, said first post electrodes or said first through- type electrodes are at the lower surface thereof and are provided with said outside electrode terminals, and said second through-type electrodes or said second post electrodes at a lower surface of said second semiconductor device are electrically connected with said first post electrodes or said first through-type electrodes at an upper surface of said first semiconductor device through joints.

2. The stacked semiconductor device according to claim 1, having a third semiconductor device stacked and secured between said first semiconductor device and said second semiconductor device, wherein said third semiconductor device comprises:

a third semiconductor substrate;

third circuit elements at a first main surface of said third semiconductor substrate;

a third multilayer wiring part on said third circuit elements and configured of a third wiring electrically connected with said third circuit elements and a third insulating material layer, the third wiring and the third insulating material layer being stacked alternately with the third insulating material layer being an uppermost layer;

a fifth insulating layer for covering said third insulating material layer of said third multilayer wiring part and provided over the first main surface of said third semiconductor substrate, said fifth insulating layer is a support member of said third semiconductor substrate;

a sixth insulating layer for covering a second main surface of said third semiconductor substrate that is opposite the first main surface of said third semiconductor substrate;

a plurality of third post electrodes on said third wiring of said third multilayer wiring part and each having a top surface and side surfaces, the top surfaces of said third post electrodes exposed from a surface of said fifth insulating layer and all the side surfaces of said third post electrodes covered by said fifth insulating layer;

a plurality of third through-type electrodes penetrating from a specified depth of said third multilayer wiring part to a surface of said sixth insulating layer through said third semiconductor substrate, said third through-type electrodes insulated from said third semiconductor substrate by a third insulating film and connected with said third wiring of said third multilayer wiring part, and the third post electrodes or the third through-type electrodes on upper/lower surfaces of said third semiconductor device are electrically connected with the first post electrodes or the first through-type electrodes of the first semiconductor device at an upper stage side and the second semiconductor device at a lower stage side through joints.

3. The stacked semiconductor device according to claim 1, wherein said first and second semiconductor devices are disposed as a single body, have a same size, and overlap each other.

4. The stacked semiconductor device according to claim 1, comprising a plurality of said second semiconductor devices that are smaller than said first semiconductor device, and are disposed and secured in parallel on said first semiconductor device.

5. The stacked semiconductor device according to claim 1, wherein the first through-type electrodes or the first post electrodes at an upper surface of said first semiconductor device and the second through-type electrodes or the second post electrodes at a lower surface of said second semiconductor device are brought into correspondence and are electrically connected respectively through said joints.

6. The stacked semiconductor device according to claim 1, wherein said joints comprise metal joining.

7. The stacked semiconductor device according to claim 1, wherein said first and second post electrodes comprise a plating film, stud bump electrodes or a CVD film.

8. The stacked semiconductor device according to claim 1, further comprising a metal plate having insulating holes and disposed between said first semiconductor device and said second semiconductor device,
wherein in a portion of said insulating holes, first ones of said first through-type electrodes or said first post electrodes at an upper surface of said first semiconductor device are electrically connected with first ones of said second through-type electrodes or said second post electrodes at a lower surface of said second semiconductor device through said joints in a state without contacting said metal plate, and second ones of said first through-type electrodes and said first post electrodes of said first semiconductor device and second ones of said second through-type electrodes and said second post electrodes of said second semiconductor device that face said metal plate are electrically connected with said metal plate through said joints.

9. The stacked semiconductor device according to claim 8, wherein the second ones of said first and second through-type electrodes or said first and second post electrodes are provided with a power supply potential or a ground potential through said metal plate.

10. The stacked semiconductor device according to claim 1, wherein one of said first and second semiconductor substrates is a silicon substrate, and another of said first and second semiconductor substrates is a compound semiconductor substrate.

11. The stacked semiconductor device according to claim 1, wherein said first and second through-type electrodes and said first and second post electrodes comprise copper, tungsten, titanium, nickel, aluminum or an alloy thereof.

12. The stacked semiconductor device according to claim 1, wherein a gap between said first semiconductor device and said second semiconductor device is filled with an insulating resin.

13. The stacked semiconductor device according to claim 1, wherein said first and second semiconductor devices respectively have the first and second post electrodes exposed in surfaces of said first and third insulating layers, and said first and second through-type electrodes exposed in surfaces of said second and fourth insulating layers, and said first and second through-type electrodes are formed at exposed ends of specified ones of said first and second post electrodes or said first and second through-type electrodes located in an upper surface.

14. The stacked semiconductor device according to claim 1, wherein said first and second post electrodes have larger diameter than said first and second through-type electrodes.

15. The stacked semiconductor device according to claim 1, wherein said first and second circuit elements are active elements and passive elements.

16. The stacked semiconductor device according to claim 1, wherein said first and second semiconductor substrates have a thickness of around 5 to 50 μm, and said first and third insulating layers have a thickness of around 20 to 100 μm.

17. A semiconductor device comprising:
a semiconductor substrate;
circuit elements at a first main surface side of said semiconductor substrate;
a multilayer wiring part on said circuit elements and configured of a wiring electrically connected with said circuit elements and an insulating layer, the wiring and the insulating layer being stacked alternately with the insulating layer being an uppermost layer;
a first insulating layer for covering said insulating layer of said multilayer wiring part and provided over the first main surface of said semiconductor substrate, said first insulating layer is a support member of said semiconductor substrate;
a second insulating layer for covering a second main surface of said semiconductor substrate that is opposite the first main surface,
wherein the first insulating layer has greater thickness than the second insulating layer;
a plurality of post electrodes on said wiring of said multilayer wiring part and each having a top surface and side surfaces, the top surfaces exposed from a surface of said first insulating layer and all the side surfaces covered by said first insulating layer; and
a plurality of through-type electrodes penetrating from a specified depth of said multilayer wiring part to a surface of said second insulating layer through said semiconductor substrate, said through-type electrodes insulated from said semiconductor substrate by an insulating film and connected with said wiring of said multilayer wiring part.

18. The semiconductor device according to claim 17, further comprising protruding electrodes at exposed ends of specified ones of said post electrodes and said through-type electrodes.

19. The semiconductor device according to claim 17, wherein said post electrodes have larger diameter than said through-type electrodes.

20. The semiconductor device according to claim 17, wherein said post electrodes are comprised of a plating film, stud bump electrodes or a CVD film.

21. The semiconductor device according to claim 17, wherein said through-type electrodes and said post electrodes are comprised of copper, tungsten, titanium, nickel, aluminum or an alloy thereof.

22. The semiconductor device according to claim 17, wherein said circuit elements are active elements and passive elements.

23. The semiconductor device according to claim 17, wherein said semiconductor substrate has a thickness of around 5 to 50 μm, and said first insulating layer has thickness of around 20 to 100 μm.

24. A semiconductor device comprising:
a semiconductor substrate having first and second main surfaces, and a circuit on the first main surface;
a multilayer wiring part including an insulating layer and a wiring pattern electrically connected with the circuit, the insulating layer and the wiring pattern disposed over the first main surface alternately with respect to each other;
a first insulating layer on an uppermost layer of said multilayer wiring part over the first main surface of said semiconductor substrate, said first insulating layer is a support member of said semiconductor substrate;
a second insulating layer over the second main surface,
wherein the first insulating layer has greater thickness than the second insulating layer;
a first electrode over the first main surface, the first electrode having top and side surfaces and electrically connected with a part of the wiring pattern, the top surface being exposed from a surface of said first insulating layer and all the side surfaces being covered with said first insulating layer; and a second electrode formed on an inner wall of a through-via which penetrates from the first main surface to the second main surface.

25. The semiconductor device according to claim 24, wherein said first insulating layer is thicker than said semiconductor substrate.

26. The semiconductor device according to claim 24, wherein said first insulating layer comprises encapsulation resin.

27. The semiconductor device according to claim 24, wherein said second electrode is a through-type electrode.

* * * * *